(12) United States Patent
Sato et al.

(10) Patent No.: US 10,321,574 B2
(45) Date of Patent: Jun. 11, 2019

(54) ELECTRONIC COMPONENT-EMBEDDED SUBSTRATE AND ELECTRONIC COMPONENT DEVICE

(71) Applicant: SHINKO ELECTRIC INDUSTRIES CO., LTD., Nagano-shi, Nagano (JP)

(72) Inventors: Junji Sato, Nagano (JP); Katsuya Fukase, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 15/718,280

(22) Filed: Sep. 28, 2017

(65) Prior Publication Data

US 2018/0098430 A1 Apr. 5, 2018

(30) Foreign Application Priority Data

Oct. 4, 2016 (JP) .................. 2016-196164

(51) Int. Cl.
*H05K 1/18* (2006.01)
*H01L 21/48* (2006.01)
*H01L 23/31* (2006.01)
*H01L 23/498* (2006.01)
*H01L 23/00* (2006.01)
*H05K 1/11* (2006.01)
*H05K 3/00* (2006.01)
*H05K 3/30* (2006.01)
*H05K 3/46* (2006.01)

(52) U.S. Cl.
CPC .......... *H05K 1/183* (2013.01); *H01L 21/486* (2013.01); *H01L 21/4857* (2013.01); *H01L 23/3185* (2013.01); *H01L 23/49822* (2013.01); *H01L 23/49827* (2013.01); *H01L 23/49838* (2013.01); *H01L 24/16* (2013.01); *H05K 1/115* (2013.01); *H05K 1/185* (2013.01); *H05K 3/0011* (2013.01); *H05K 3/301* (2013.01); *H01L 2224/16235* (2013.01); *H01L 2224/16267* (2013.01); *H01L 2924/1205* (2013.01); *H01L 2924/1432* (2013.01); *H05K 3/4602* (2013.01); *H05K 2201/10015* (2013.01); *H05K 2201/10636* (2013.01); *H05K 2203/0191* (2013.01); *H05K 2203/1469* (2013.01); *Y02P 70/611* (2015.11)

(58) Field of Classification Search
USPC ................................ 361/761, 760
See application file for complete search history.

(56) References Cited

U.S. PATENT DOCUMENTS

2012/0287586 A1* 11/2012 Mikado .................. H05K 1/185
                                                               361/748
2014/0104797 A1*  4/2014 Machida ................ H05K 1/181
                                                               361/760
2014/0153205 A1   6/2014 Mikado et al.

FOREIGN PATENT DOCUMENTS

WO    2012/157426    11/2012

* cited by examiner

*Primary Examiner* — Andargie M Aychillhum
(74) *Attorney, Agent, or Firm* — Rankin, Hill & Clark LLP

(57) ABSTRACT

An electronic component-embedded substrate includes a core substrate, a cavity penetrating the core substrate, a wiring layer formed on one surface of the core substrate, a support pattern extending over the cavity and configured to divide the cavity into a plurality of component embedding areas, an insulation wall portion arranged on a part of the support pattern in the cavity and formed of the same material as the core substrate, a plurality of electronic components each of which is mounted in each of the plurality of component embedding areas, and an insulating material filling an inside of the cavity.

11 Claims, 29 Drawing Sheets (PARTIAL PLAN VIEW)

(PARTIAL PLAN VIEW)

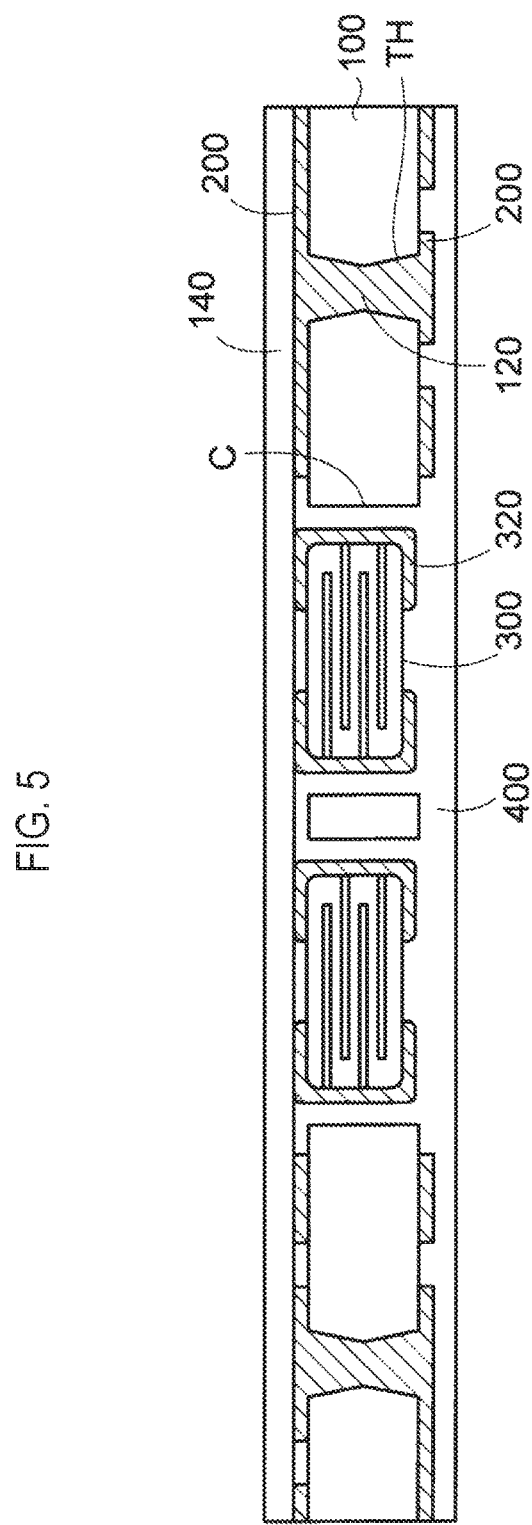

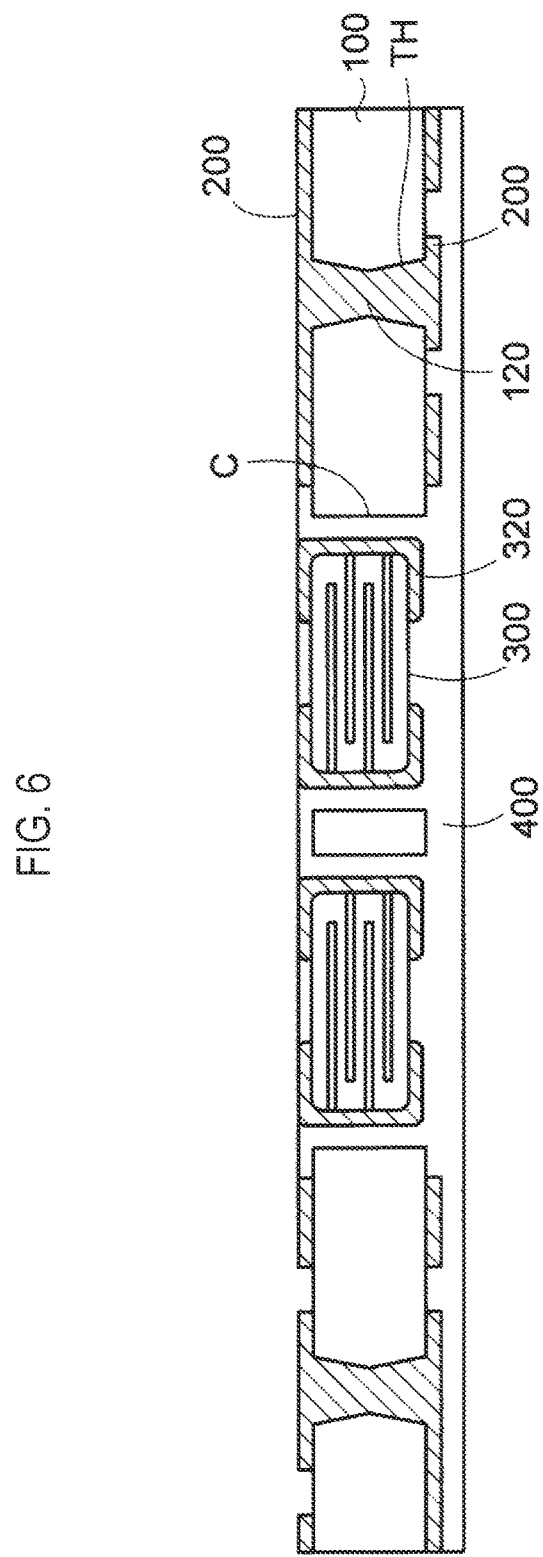

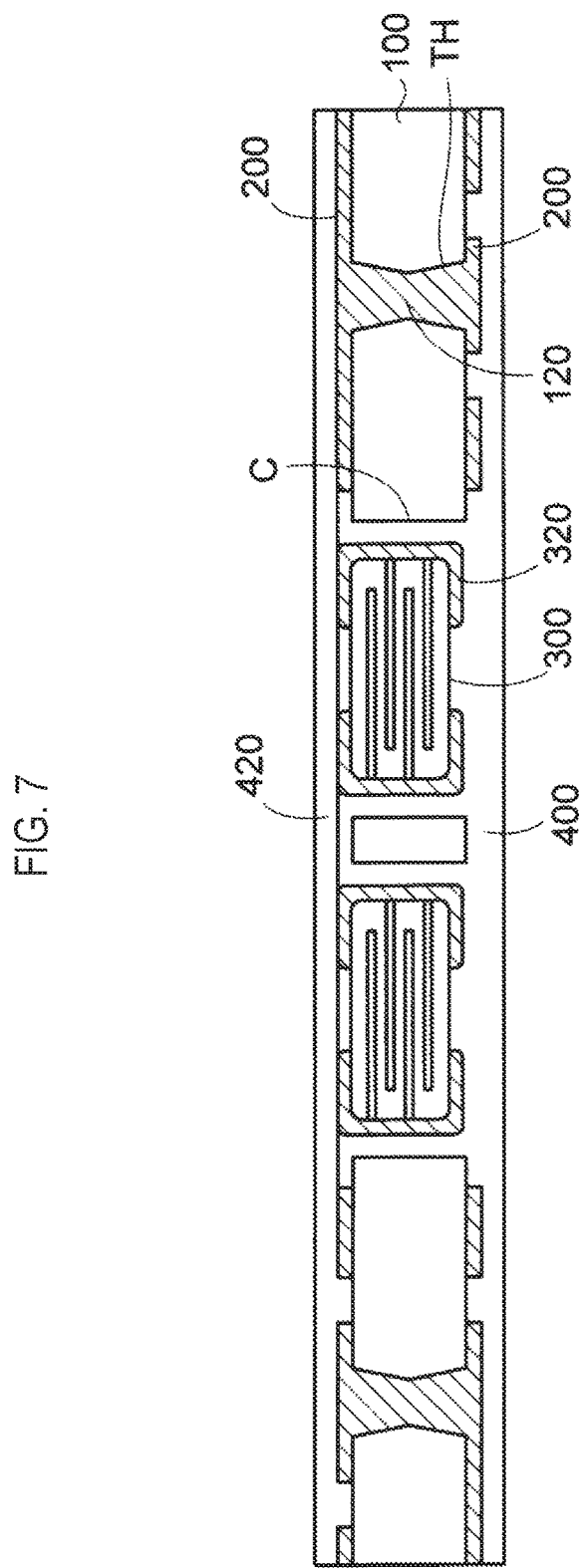

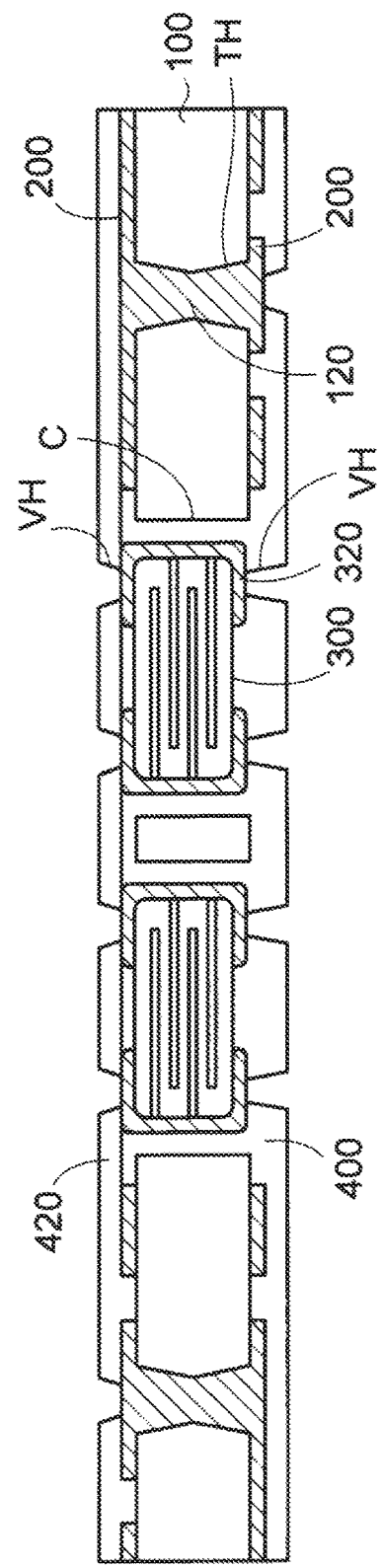

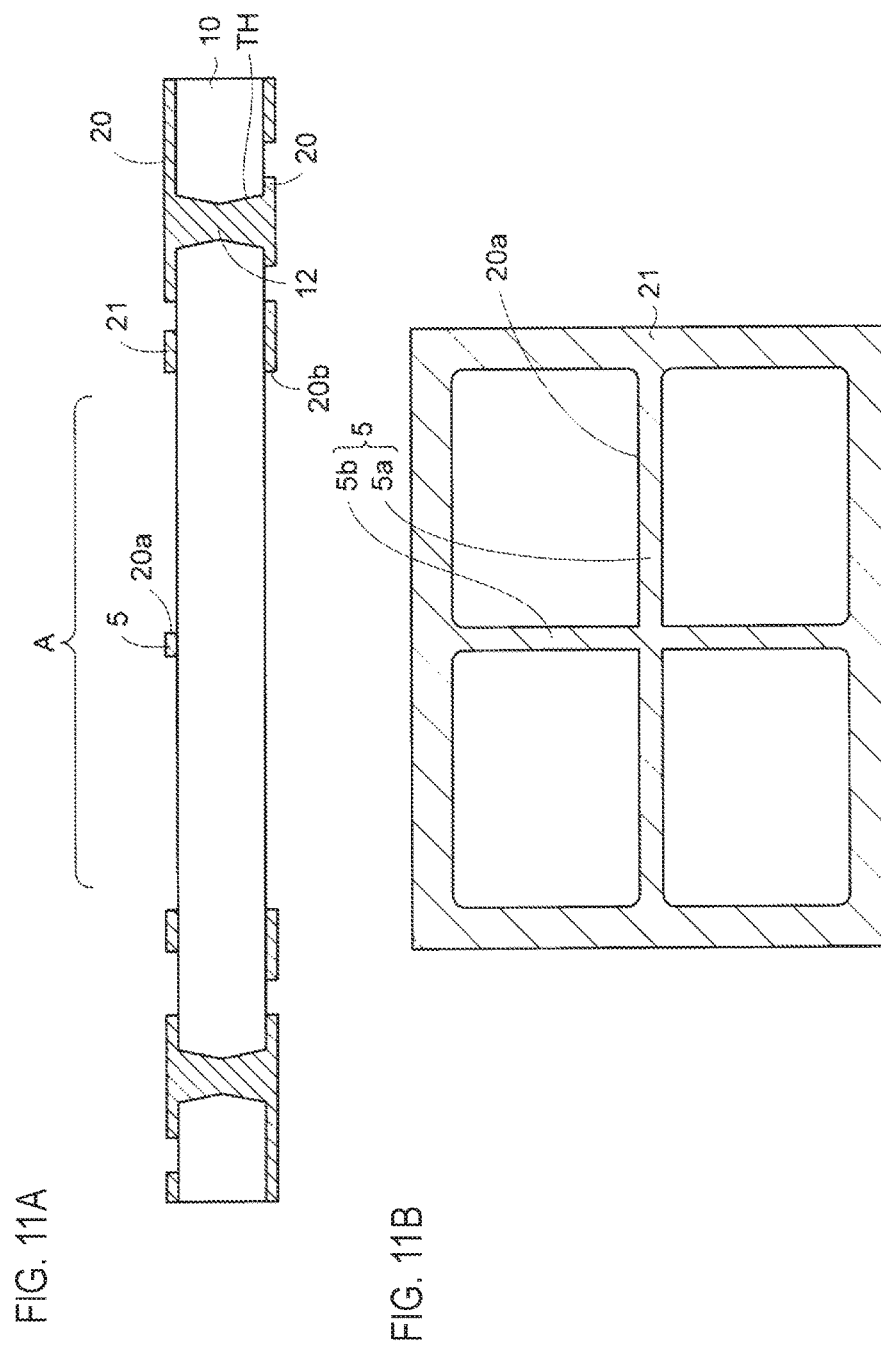

US 10,321,574 B2

ELECTRONIC COMPONENT-EMBEDDED SUBSTRATE AND ELECTRONIC COMPONENT DEVICE

CROSS-REFERENCE TO RELATED APPLICATION

The present application claims priority from Japanese Patent Application No. 2016-196164 filed on Oct. 4, 2016, the entire content of which is incorporated herein by reference.

BACKGROUND

Technical Field

The present invention relates to an electronic component-embedded substrate and an electronic component device.

Related Art

In the related art, an electronic component-embedded substrate in which electronic components such as semiconductor chips, capacitors and the like are embedded has been known. In the electronic component-embedded substrate, the electronic components are arranged in a cavity formed in a core substrate, and a wiring layer is connected to the electronic components.

Patent Document 1: WO2012/157426

As described later in paragraphs of preliminary matters, when mounting a plurality of capacitors in the cavity of the core substrate, connection terminals of the capacitors are contacted to each other in an area to which the plurality of capacitors is respectively adjacent, so that an electric short may be caused.

SUMMARY

Exemplary embodiments of the invention provide an electronic component-embedded substrate having a novel structure capable of reliably mounting a plurality of electronic components in a cavity of a core substrate, and an electronic component device.

An electronic component-embedded substrate according to an exemplary embodiment, comprises:

a core substrate;
a cavity penetrating the core substrate;
a wiring layer formed on one surface of the core substrate;
a support pattern extending over the cavity and configured to divide the cavity into a plurality of component embedding areas;
an insulation wall portion arranged on a part of the support pattern in the cavity and formed of the same material as the core substrate;
a plurality of electronic components each of which is mounted in each of the plurality of component embedding areas; and
an insulating material filling an inside of the cavity.

The support pattern may be formed of the same layer as the wiring layer.

A manufacturing method of an electronic component-embedded substrate, according to an exemplary embodiment, the method comprises;

preparing a core substrate;

forming a wiring layer and a support pattern formed of the same layer as the wiring layer on one surface of the core substrate;

forming a plurality of component embedding areas penetrating the core substrate at positions at which the component embedding areas face each other with the support pattern being interposed therebetween;

forming one cavity, in which the plurality of component embedding areas is coupled, and forming an insulation wall portion formed of the same material as the core substrate on the support pattern by removing a portion of the core substrate positioned on the support pattern between the plurality of component embedding areas;

mounting each of electronic components in each of the plurality of component embedding areas; and filling an inside of the cavity with an insulating material.

According to the following present invention, the core substrate of the electronic component-embedded substrate is formed with the cavity penetrating in a thickness direction. One surface of the core substrate is formed with the support pattern formed of the same layer as the wiring layer over the cavity.

The inside of the cavity is divided into the plurality of component embedding areas by the support pattern. Also, the insulation wall portion formed of the same material as the core substrate is arranged on the inner surface of the support pattern.

In the plurality of component embedding areas, the electronic components are respectively arranged, and the insulation wall portion is arranged between the plurality of electronic components.

Thereby, when mounting the plurality of electronic components, for example, the electronic components are prevented from contacting each other by the insulation wall portion even though the electronic components are inclined or positionally deviated.

Also, since the insulation wall portion is arranged on the support pattern, it is possible to arrange the insulation wall portion at any position on the inner surface of the support pattern with being separated from the core substrate.

Thereby, for example, even when mounting the four electronic components in a two-row and two-column form in the cavity of the core substrate, the insulation wall portion can be arranged even at the central portion of the cavity to which the four electronic components are adjacent, so that the electric short between the electronic components is prevented.

BRIEF DESCRIPTION OF THE DRAWINGS

FIG. 5 is a sectional view depicting the manufacturing method of the electronic component-embedded substrate relating to the preliminary matters (5 thereof).

FIG. 6 is a sectional view depicting the manufacturing method of the electronic component-embedded substrate relating to the preliminary matters (6 thereof).

FIG. 7 is a sectional view depicting the manufacturing method of the electronic component-embedded substrate relating to the preliminary matters (7 thereof).

FIG. 8 is a sectional view depicting the manufacturing method of the electronic component-embedded substrate relating to the preliminary matters (8 thereof).

FIGS. 11A and 11B are a sectional view and a partial plan view depicting a manufacturing method of an electronic component-embedded substrate according to an exemplary embodiment (1 thereof).

DETAILED DESCRIPTION

Hereinafter, an exemplary embodiment will be described with reference to the accompanying drawings.

Before describing the exemplary embodiment, preliminary matters, which are bases of the present invention, are first described. It should be noted that the preliminary matters relate to personal investigation contents of the inventors and include a novel technology, not a known technology.

FIGS. 1 to 10B illustrate a manufacturing method of an electronic component-embedded substrate relating to the preliminary matters.

Figure 1:
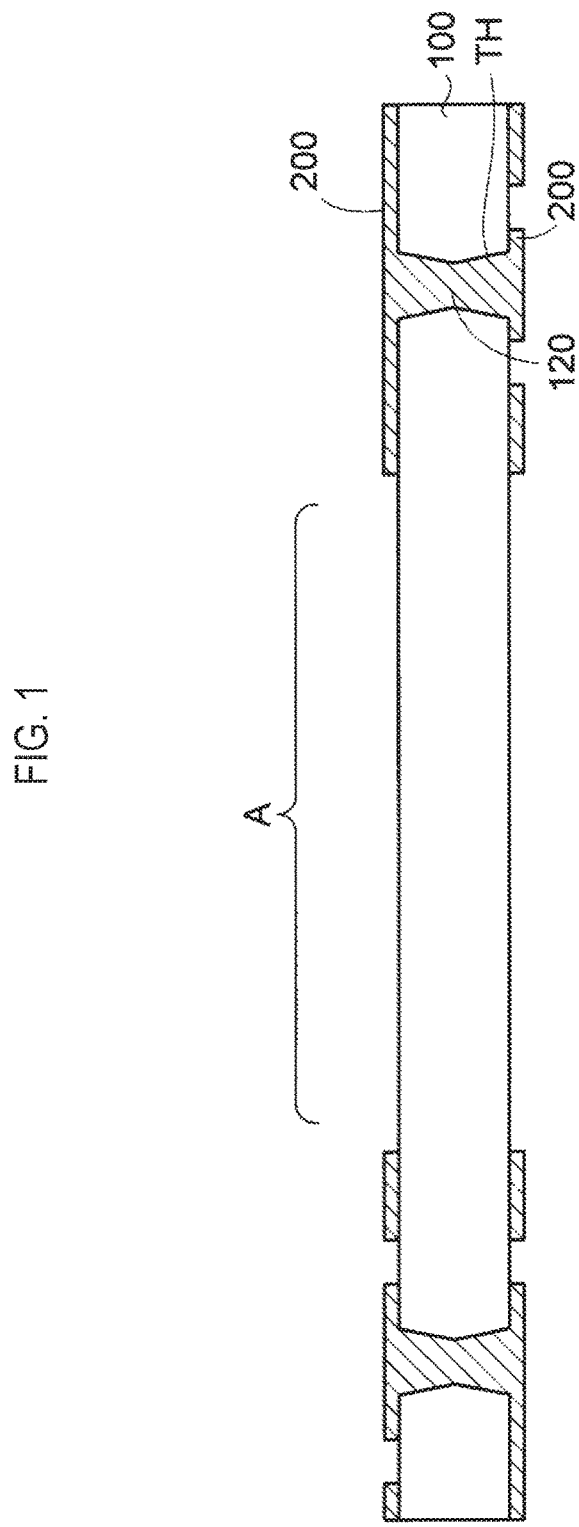
FIG. 1 is a sectional view depicting a manufacturing method of an electronic component-embedded substrate relating to preliminary matters (1 thereof).

In the manufacturing method of the electronic component-embedded substrate relating to the preliminary matters, a core substrate 100 having a structure as shown in FIG. 1 is first prepared. Both surfaces of the core substrate 100 are formed with first wiring layers 200, respectively. The core substrate 100 is formed with through-holes TH, the first wiring layers 200 on both the surfaces are connected to each other via through-conductors 120 in the through-holes TH.

For the core substrate 100, a cavity formation area A is defined. Both surfaces of the cavity formation area. A of the core substrate 100 are not formed with the first wiring layer 200, and are configured as a collective opening.

Figure 2A:
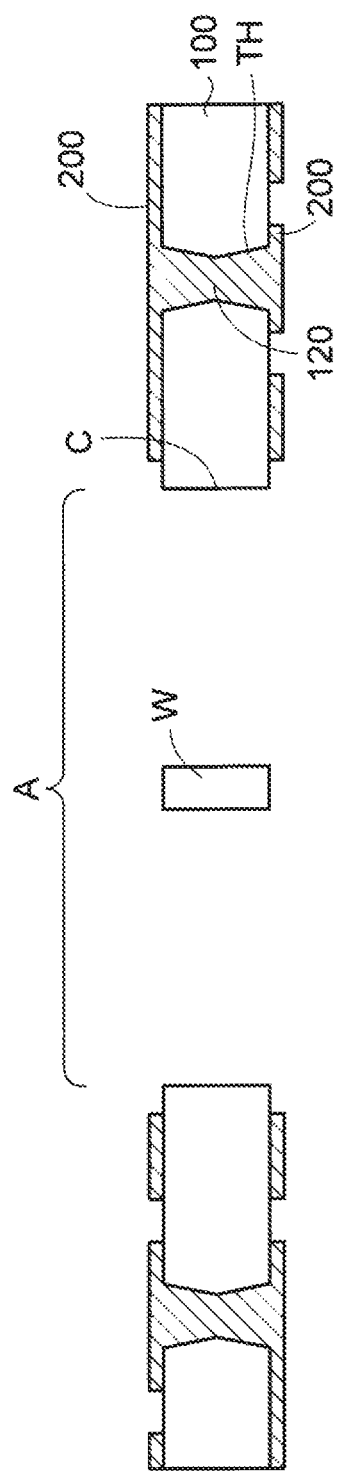
FIGS. 2A and 2B are a sectional view and a plan view depicting the manufacturing method of the electronic component-embedded substrate relating to the preliminary matters (2 thereof).

Then, as shown in FIG. 2A, the cavity formation area A of the core substrate 100 is subjected to laser processing to form a cavity C penetrating in a thickness direction.

Figure 2B:
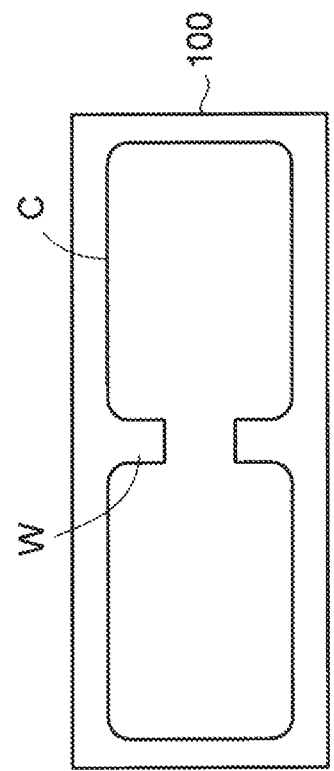

At this time, as shown in a partial plan view of FIG. 2B, insulation wall portions W having a projection shape are respectively formed at central portions of a pair of sidewalls facing each other in a longitudinal direction of the cavity C. The insulation wall portion W is arranged as a portion of the core substrate 100 is left on the sidewall of the cavity C.

An inside of the cavity C is divided into two component embedding areas by the insulation wall portions W, and capacitors are respectively mounted in the two component embedding areas.

The insulation wall portions W are provided so as to prevent an electric short, which is caused due to contact of connection terminals of the adjacent capacitors when mounting the two capacitors.

Figure 3:
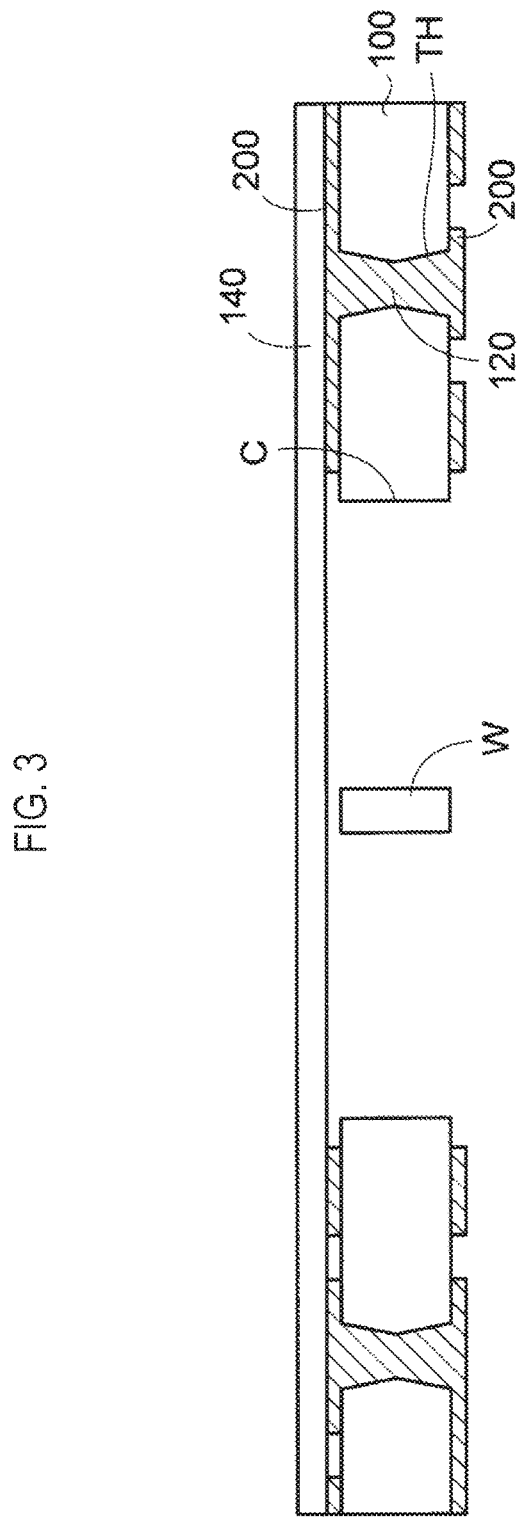
FIG. 3 is a sectional view depicting the manufacturing method of the electronic component-embedded substrate relating to the preliminary matters (3 thereof).

Then, as shown in FIG. 3, a temporary fixing tape 140 is bonded to an upper surface of the core substrate 100.

Figure 4A:
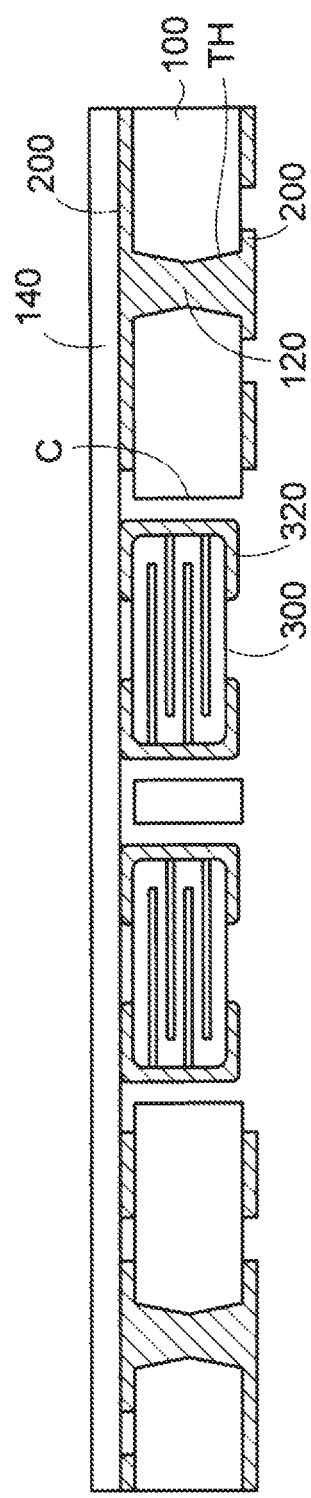
FIGS. 4A and 4B are a sectional view and a plan view depicting the manufacturing method of the electronic component-embedded substrate relating to the preliminary matters (4 thereof).

Also, as shown in FIG. 4A, capacitors 300 each of which has connection terminals 320 provided at both ends thereof are prepared, and upper surfaces of the capacitors 300 are bonded to the temporary fixing tape 140 in the cavity C of the core substrate 100.

Figure 4B:
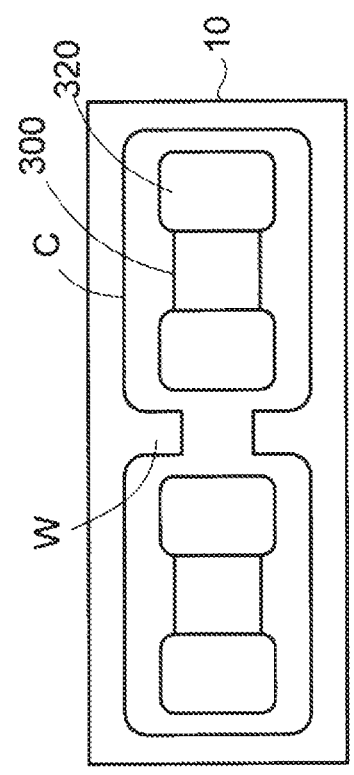

At this time, as shown in a partial plan view of FIG. 4B, the capacitors 300 are respectively arranged in the two component embedding areas in the cavity C of the core substrate 100.

Then, as shown in FIG. 5, a resin film is stacked on a lower surface of the core substrate 100, so that a first insulation layer 400 is formed. Thereby, side surfaces and lower surfaces of the capacitors 300 are sealed by the first insulation layer 400.

Subsequently, as shown in FIG. 6, the temporary fixing tape 140 is peeled off from the core substrate 100, so that the upper surfaces of the core substrate 100 and the capacitors 300 are exposed.

Also, as shown in FIG. 7, a resin film is stacked on the upper surface of the core substrate 100, so that a second insulation layer 420 is formed. Thereby, the upper surfaces of the capacitors 300 are sealed by the second insulation layer 420.

Subsequently, as shown in FIG. 8, the first insulation layer 400 formed on the lower surface of the core substrate 100 is subjected to the laser processing to form via-holes VH that reach the lower surfaces of the connection terminals 320 of the capacitors 300 and the first wiring layer 200.

At the same time, the second insulation layer 420 formed on the upper surface of the core substrate 100 is subjected to the laser processing to form via-holes VH that reach the upper surfaces of the connection terminals 320 of the capacitors 300 and the first wiring layer 200.

Figure 9:
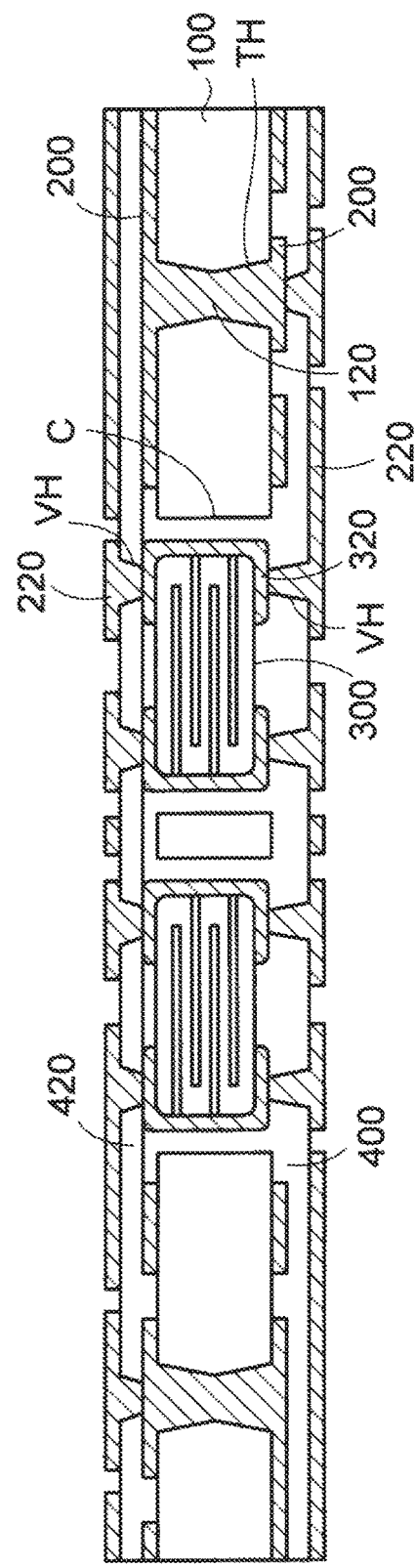
FIG. 9 is a sectional view depicting the manufacturing method of the electronic component-embedded substrate relating to the preliminary matters (9 thereof).

Thereafter, as shown in FIG. 9, second wiring layers 220 are respectively formed on the first insulation layer 400 and the second insulation layer 420. The second wiring layer 220 on the first insulation layer 400 is connected to the lower surfaces of the connection terminals 320 of the capacitors 300 and the first wiring layer 200 through the via-holes VH.

Likewise, the second wiring layer 220 on the second insulation layer 420 is connected to the upper surfaces of the connection terminals 320 of the capacitors 300 and the first wiring layer 200 through the via-holes VH.

In the process of FIGS. 4A and 4B, the two capacitors 300 are mounted side by side in a lateral direction. In this case, even when the two capacitors 300 are mounted with being rotated and inclined, the connection electrodes 320 of the two capacitors 300 are prevented from contacting each other by the insulation wall portions W arranged therebetween.

Figure 10A:
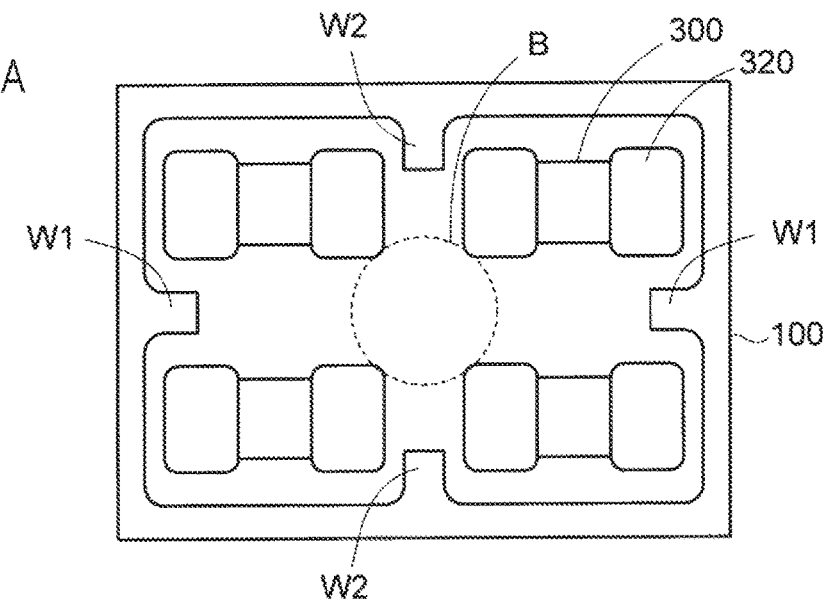
FIGS. 10A and 10B are plan views for illustrating a problem of the manufacturing method of the electronic component-embedded substrate relating to the preliminary matters.
Figure 10B:
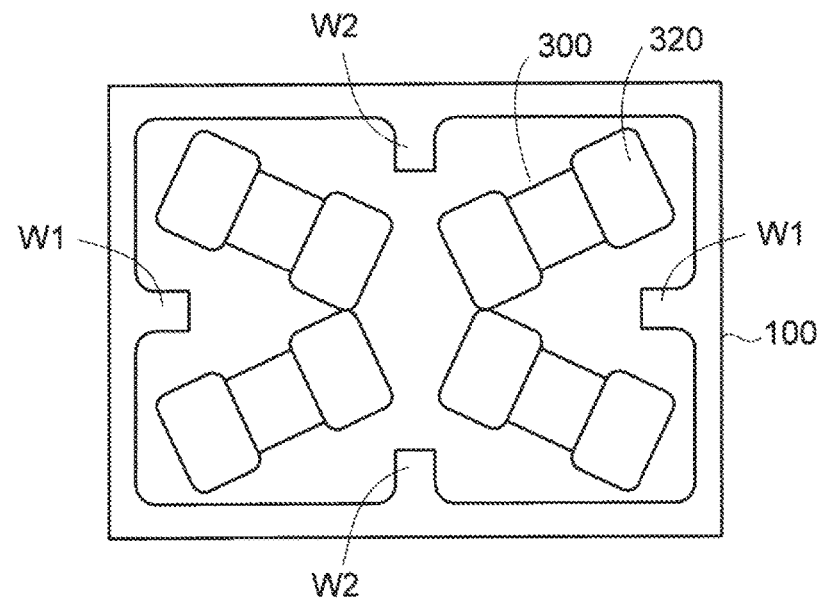

FIGS. 10A and 10B depict an aspect where the four capacitors are mounted in the cavity C of the core substrate 100.

As shown in FIG. 10A, when mounting the four capacitors 300, first insulation wall portions W1 having a projection shape are respectively formed at central portions of a pair of sidewalls of the cavity C facing each other in the lateral direction. Also, likewise, second insulation wall portions W2 having a projection shape are respectively formed at central portions of a pair of sidewalls of the cavity C facing each other in the longitudinal direction.

Here, it is not possible to arrange a cross-shaped insulation wall portion, which is formed by the core substrate 100, in an area B surrounded by a dotted line to which the four capacitors 300 of FIG. 10A are adjacent, with being separated from the first insulation wall portions W1 and the second insulation wall portions W2.

For this reason, as shown in FIG. 10B, when mounting the capacitors or when sealing the capacitors with the resin, if the capacitors are rotated and inclined, the connection terminals 320 of the capacitors 300 adjacent to each other in the longitudinal direction are contacted, so that an electric short may be caused.

As a measure against the above problem, the first insulation wall portions W1 and the second insulation wall portions W2 may be extended so that the insulation wall portions are arranged up to the area B of FIG. 10A. However, when improving a mounting density by narrowing an arrangement pitch of the plurality of capacitors 300, it is necessary to highly reduce a wall thickness of the insulation wall portion.

For this reason, according to the method of forming the insulation wall portion only by the core substrate 100, it is not possible to secure the sufficient strength when the wall thickness of the insulation wall portion is reduced. Therefore, when mounting the capacitors or when sealing the capacitors with the resin, the insulation wall portion may be damaged, so that it is not possible to reliably arrange the insulation wall portion.

Also, since it is necessary to arrange the insulation wall portion with being coupled to the core substrate, it is not possible to arbitrarily divide and arrange the insulation wall portion at a necessary portion.

According to an electronic component-embedded substrate of an exemplary embodiment to be described below, the above problems can be solved.

Exemplary Embodiment

Figure 27:
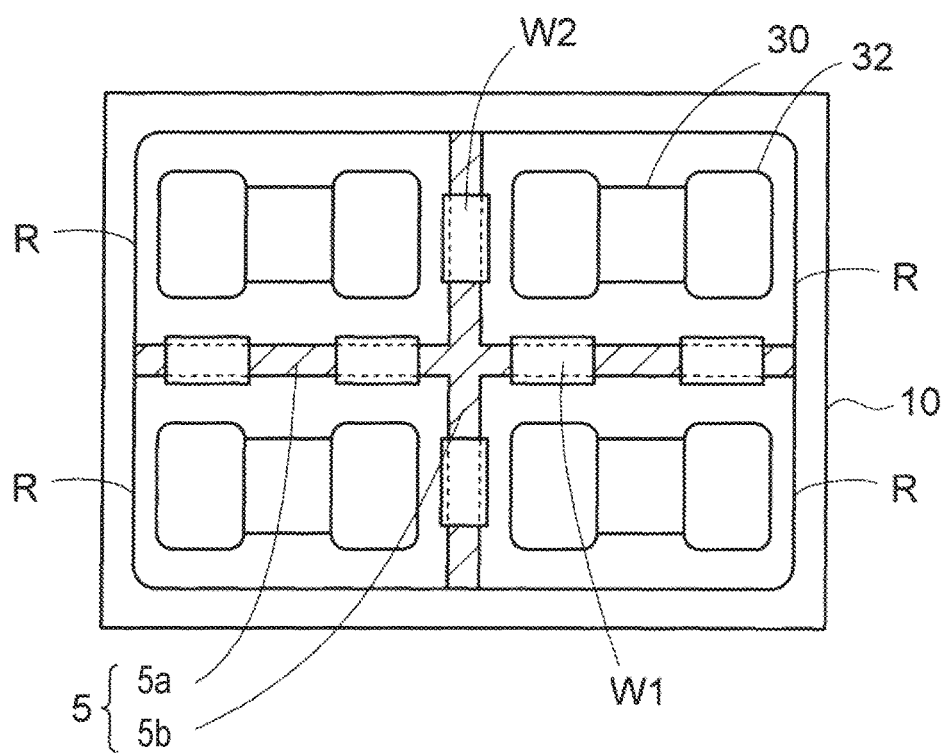
FIG. 27 is a plan view depicting an electronic component-embedded substrate according to a second modified embodiment of the exemplary embodiment.
Figure 28A:
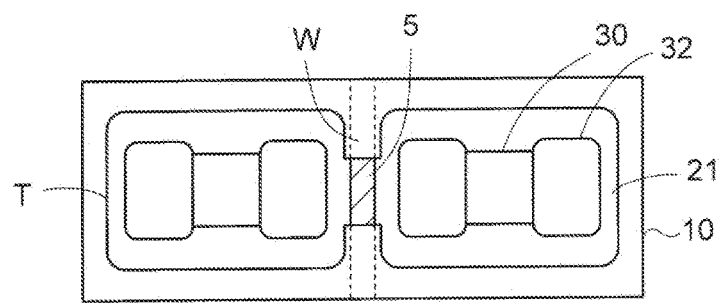
FIGS. 28A and 28B are plan views depicting a structure around the cavity in a case where two electronic components are mounted to the electronic component-embedded substrate.
Figure 28B:
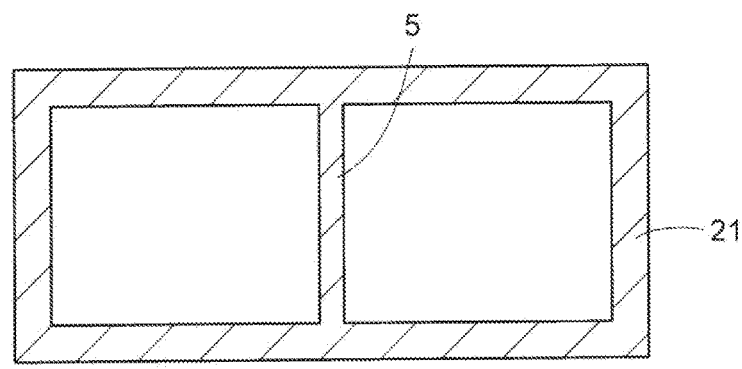
Figure 29:
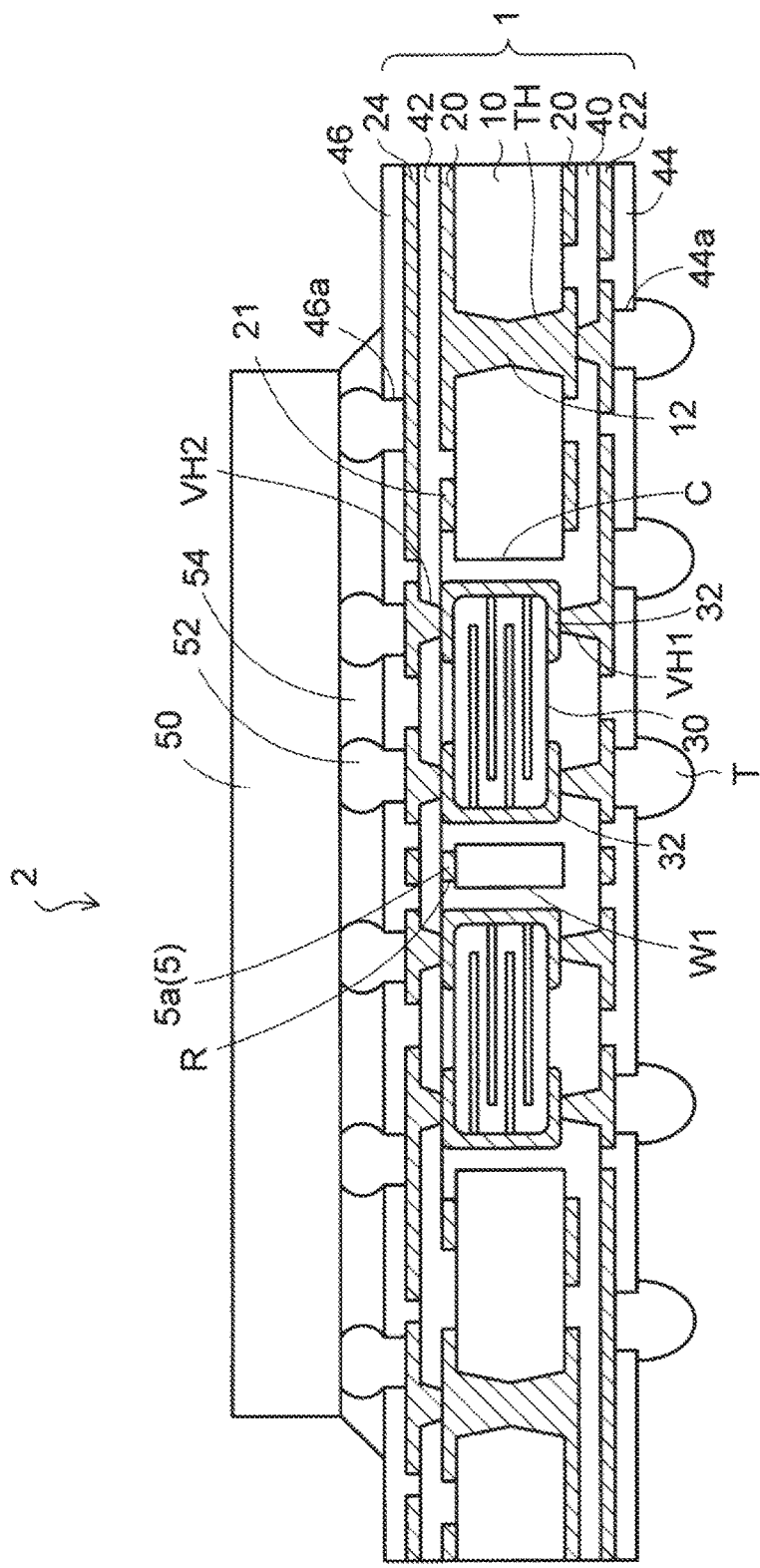
FIG. 29 is a sectional view depicting an electronic component device of the exemplary embodiment.

FIGS. 11A to 22B illustrate a manufacturing method of an electronic component-embedded substrate of an exemplary embodiment, FIGS. 23 to 28B illustrate an electronic component-embedded substrate of the exemplary embodiment, and FIG. 29 depicts an electronic component device of the exemplary embodiment.

In the below, structures of the electronic component-embedded substrate and the electronic component device are described while describing the manufacturing method of the electronic component-embedded substrate.

In the manufacturing method of the electronic component-embedded substrate of the exemplary embodiment, a core substrate 10 having a structure as shown in FIG. 11A is first prepared. The core substrate 10 is formed of an insulating material such as an epoxy resin having glass cloth inserted therein.

Both surfaces of the core substrate 10 are formed with first wiring layers 20, respectively. The core substrate 10 is formed with through-holes TEL penetrating in a thickness direction. The first wiring layers 20 on both the surfaces are connected to each other by means of through-conductors 12 formed in the through-holes TH. A thickness of the core substrate 10 is 60 μm to 500 μm, for example.

Alternatively, a through-hole plating layer may be formed on an inner wall of the through-hole TH of the core substrate 10 and the remaining portion of the through-hole TH may be filled with a resin. In this case, the first wiring layers 20 on both the surfaces are connected to each other by the through-hole plating layer.

The through-hole TH is formed by a drill or laser. The first wiring layer 20 and the through-conductor 12 are made of copper or the like, and are formed using photolithography, plating, wet-etching and the like.

In the exemplary embodiment, one surface of the core substrate 10 is set as an upper surface, and the other surface is set as a lower surface.

For the core substrate 10, a cavity formation area A in which a cavity is to be arranged is defined. In the exemplary embodiment, an aspect where four electronic components are mounted side by side in the cavity is exemplified.

As shown in a partial plan view of FIG. 11B, a cross-shaped support pattern 5 is arranged in the rectangular cavity formation area A of the upper surface of the core substrate 10, and four openings 20a of the support pattern 5 are arranged in the cavity formation area A. The support pattern 5 is configured by a lateral pattern 5a and a longitudinal pattern 5b intersecting with each other.

The support pattern 5 is arranged to extend over the cavity formation area A in a lateral direction and a longitudinal direction. The lateral and longitudinal end portions of the support pattern 5 are coupled and supported to a ring-shaped conductor layer 21.

The first wiring layer 20, the support pattern 5 and the conductor layer 21 are patterned and formed at the same time by performing photolithography and etching for a metal layer made of copper, aluminum or the like. In this way, the support pattern 5 and the conductor layer 21 are formed by the same layer as the first wiring layer 20.

The first wiring layer 20 is an electric wiring for establishing an electric circuit. The support pattern 5 and the conductor layer 21 are electrically insulated from the first wiring layer 20, and are formed as floating conductors. Alternatively, the support pattern 5 may be electrically connected to the first wiring layer 20.

Also, a lower surface of the cavity formation area A of the core substrate 10 is not formed with the first wiring layer 20, and the cavity formation area A is entirely configured as an opening 20b.

Subsequently, a method of forming the cavity in the core substrate 10 is described with reference to partial plan views of FIGS. 12A to 12D.

In the exemplary embodiment, the core substrate 10 is first formed with four cavities so as to correspond to the four openings 20a of the support pattern 5.

Figure 12A:
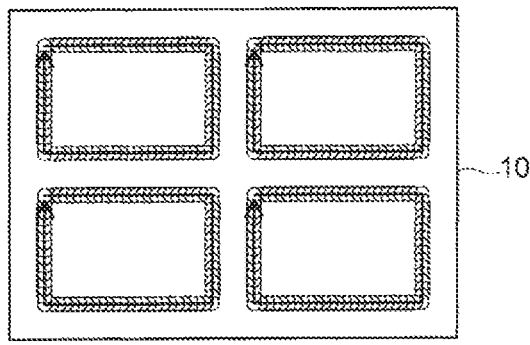
FIGS. 12A to 12D are sectional views depicting the manufacturing method of the electronic component-embedded substrate according to the exemplary embodiment (2 thereof).

As shown in FIG. 12A, the laser processing is performed from an opposite surface to the surface of the core substrate 10 on which the support pattern 5 is formed. In FIG. 11A, the laser processing is performed from the lower surface of the core substrate 10. At this time, the core substrate 10 is sequentially subjected to the laser processing along portions becoming sidewalls of the four cavities, so that the unnecessary portions of the core substrate 10 are removed.

Figure 12B:
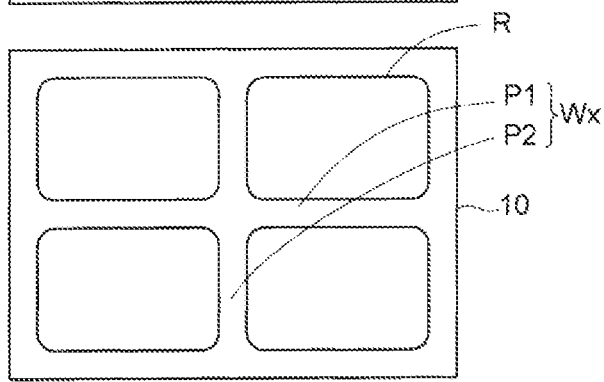

Thereby, as shown in FIG. 12B, four component embedding areas R, which are through-holes corresponding to the four openings 20a of the support pattern 5, are formed. At the same time, a cross-shaped wall plate Wx consisting of a part of the core substrate 10 is arranged on the cross-shaped support pattern 5 (FIG. 11B).

A width of the wall plate Wx is set greater than a width of the support pattern 5. The cross-shaped wall plate Wx is configured by a lateral pattern P1 and a longitudinal pattern P2 intersecting with each other.

Alternatively, the cavity formation area. A of the core substrate 10 may be formed with the four similar component embedding areas R by using a laser device capable of collectively processing a predetermined surface area by laser illumination.

In this way, as shown in FIGS. 12A and 12B, a plurality of component embedding areas R penetrating the core substrate 10 is formed at positions facing each other with the support pattern 5 (FIG. 11B) being interposed therebetween, as seen from a plan view.

Figure 12C:
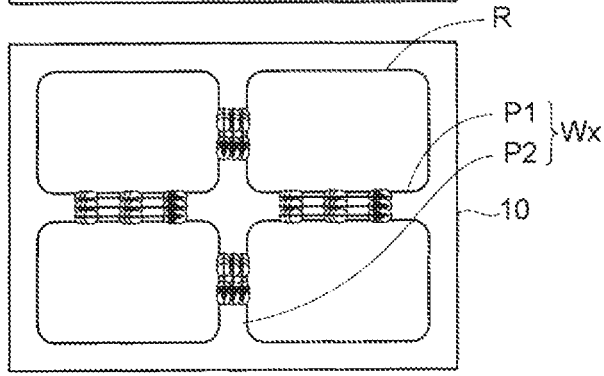

Also, as shown in FIG. 12C, central portions of the lateral pattern P1 arranged at both sides of the longitudinal pattern P2 of the cross-shaped wall plate Wx are subjected to the laser processing. Also, likewise, central portions of the longitudinal pattern P2 arranged at both sides of the lateral pattern P1 of the cross-shaped wall plate Wx are subjected to the laser processing.

Figure 12D:
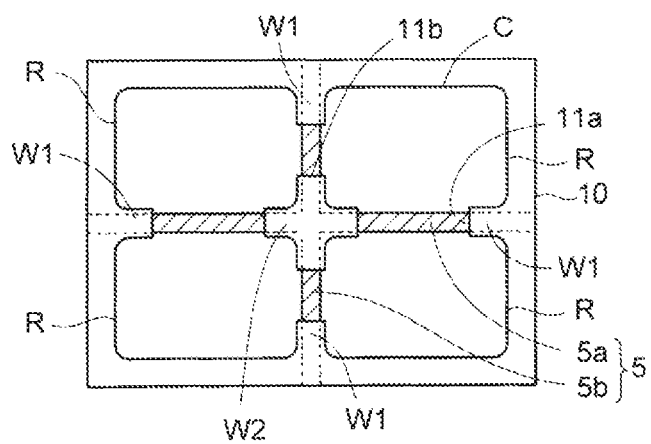

Thereby, as shown in FIG. 12D, first openings 11a are respectively formed at the central portions of the lateral pattern P1 arranged at both sides of the longitudinal pattern P2. Also, likewise, second openings 11b are respectively formed at the central portions of the longitudinal pattern P2 arranged at both sides of the lateral pattern P1.

When laser processing the wall plate Wx to form the first openings 11a and the second openings 11b, the support pattern 5 remains as it is not damaged by the laser, and only the unnecessary portions of the wall plate Wx are removed.

Thereby, as shown in FIG. 12D, the cross-shaped wall plate Wx is formed with the first openings 11a and the second openings 11b, so that the four component embedding areas R partitioned by the cross-shaped wall plate Wx are coupled to form one integral cavity C.

Also, the cross-shaped wall plate Wx is patterned, so that the first insulation wall portions W1 are respectively arranged at four end portions of the cross-shaped support pattern 5. The first insulation wall portion W1 is coupled to the core substrate 10 of the sidewall of the cavity C, so that it has a projection shape.

Also, a cross-shaped second insulation wall portion W2 is arranged at an intersection portion of the cross-shaped support pattern 5. The cross-shaped second insulation wall portion W2 is formed with being separated from the core substrate 10.

Thereby, as shown in FIG. 12D, the cavity C is divided into the four component embedding areas R by the support pattern 5, as seen from a plan view.

In this way, as shown in FIGS. 12C and 12D, the portions of the core substrate 10 between the plurality of component embedding areas R on the support pattern 5 are removed to form one cavity C in which the plurality of component embedding areas R is coupled.

Also, at the same time, the first and second insulation wall portions W1, W2 made of the same material as the core substrate 10 are formed on the support pattern 5.

In the example of FIG. 12D, since the four capacitors are mounted, the four component embedding areas R are defined in the cavity C by the support pattern 5.

When the number of the openings 20a of the support pattern 5 is adjusted in conformity to the number of the plurality of capacitors to be mounted, it is possible to define the necessary number of the component embedding areas R in the cavity C.

The support pattern 5 having a lattice shape may be formed by intersecting a plurality of lateral patterns 5a and a plurality of longitudinal patterns 5b.

Figure 13A:
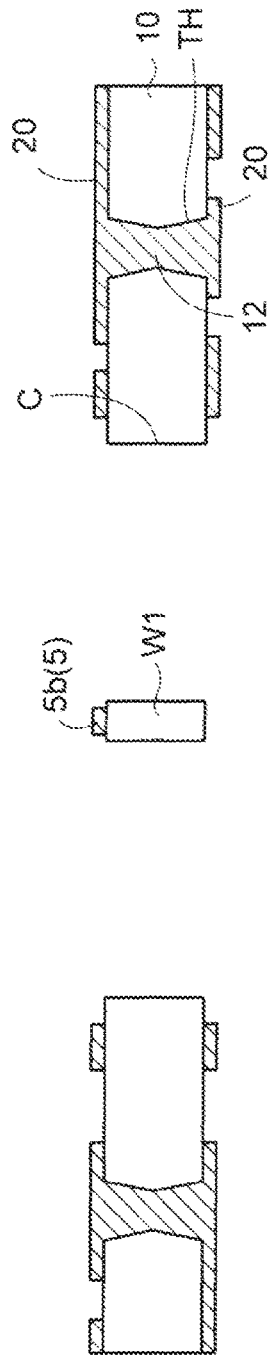
FIGS. 13A and 13B are a sectional view and a plan view depicting the manufacturing method of the electronic component-embedded substrate according to the exemplary embodiment (3 thereof).
Figure 13B:
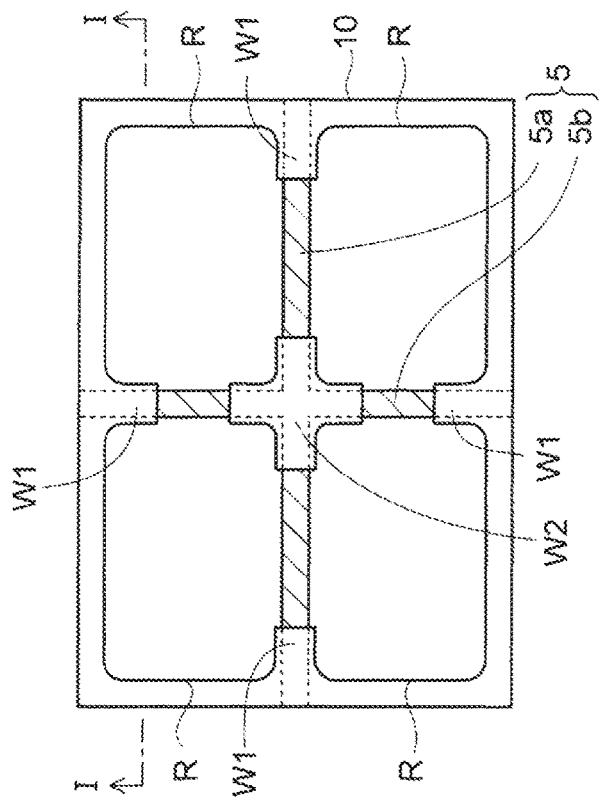

By the above method, as shown in FIGS. 13A and 13B, the first insulation wall portions W1 and the second insulation wall portion W2 are divided and formed on the inner surface of the support pattern 5 in the cavity C of the core substrate 10.

FIG. 13B is a partial plan view of a structure around the cavity C of a sectional view of FIG. 13A, as seen from below. FIG. 13A depicting a structure around the cavity. C is a sectional view taken along a line I-I of FIG. 13B.

As shown in FIG. 13B, in the process of forming the cavity C penetrating the core substrate 10, the support pattern 5 is arranged to extend over the cavity C. Also, at the same time, the first insulation wall portions W1 and the second insulation wall portion W2 made of the same material as the core substrate 10 are arranged on the inner surface of the support pattern 5. In addition, at the same time, the plurality of component embedding areas R is defined in the cavity C by the support pattern 5, as seen from a plan view.

In the exemplary embodiment, since the insulation wall portion is formed on the support pattern 5, it is possible to separate the insulation wall portion from the core substrate 10 and to arrange the same at any position on the support pattern 5. Also, since the insulation wall portion is reinforced by the support pattern 5, the sufficient strength is secured even though the wall thickness of the insulation wall portion is reduced.

Figure 14:
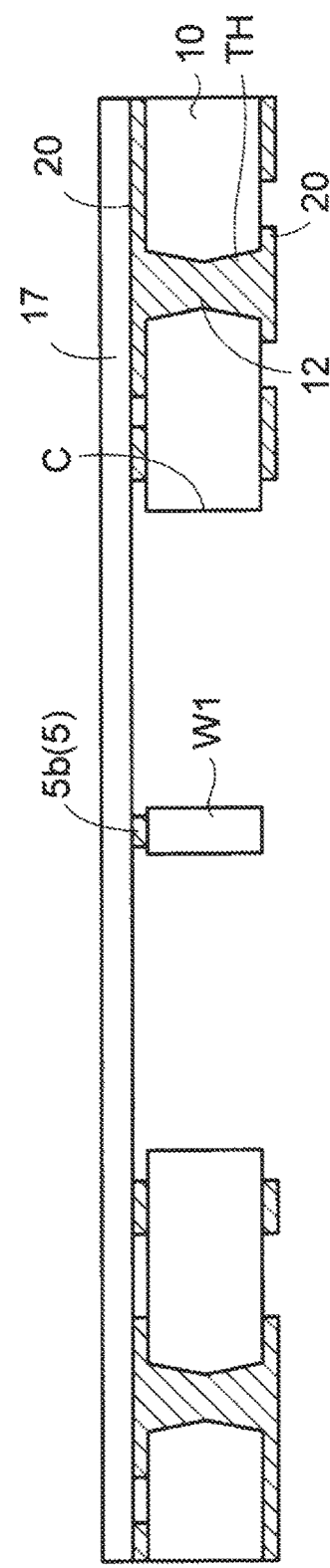
FIG. 14 is a sectional view depicting the manufacturing method of the electronic component-embedded substrate according to the exemplary embodiment (4 thereof).
Figure 15A:
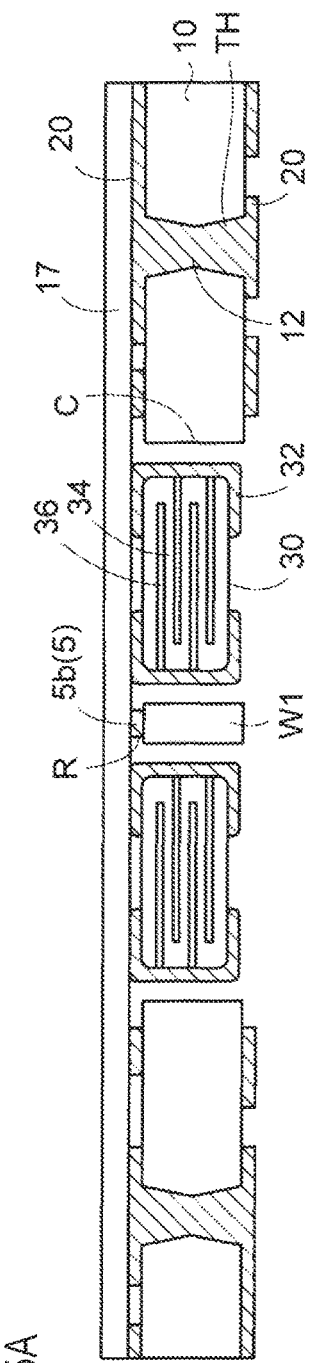
FIGS. 15A and 15B are a sectional view and a plan view depicting the manufacturing method of the electronic component-embedded substrate according to the exemplary embodiment (5 thereof).

Subsequently, as shown in FIG. 14, a temporary fixing tape 17 is bonded to the upper surface of the core substrate 100. Also, as shown in FIG. 15A, capacitors 30 are prepared. The capacitor 30 shown in FIG. 15A is a stacked ceramic chip capacitor where a dielectric layer 34 and an internal electrode 36 are stacked in a multi-layer structure.

The capacitor 30 has connection terminals 32 at both horizontal ends, and the connection terminal 32 is connected to one end of the stacked internal electrode 36.

The connection terminals 32 provided at both ends of the capacitor 30 are formed to cover a capacitor main body from an upper surface end portion to a lower surface end portion, respectively, and the wiring layer can be connected to the upper surface and the lower surface of the connection terminal 32. The capacitor 30 is an example of the electronic component.

The upper surface of the capacitor 30 is bonded to the temporary fixing tape 17 in the cavity C of the core substrate 10.

Figure 15B:
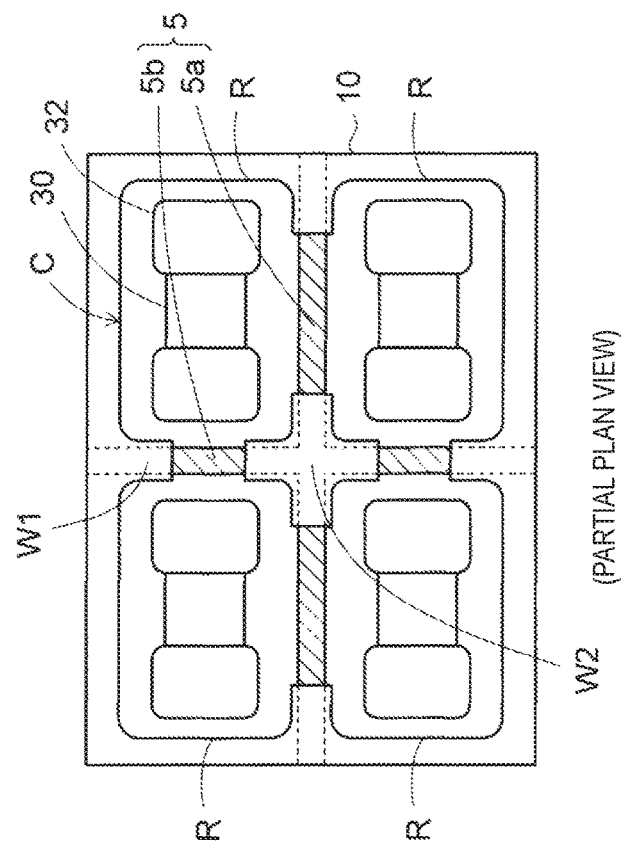

As shown in a partial plan view of FIG. 15B, the capacitors 30 are respectively mounted in the four component embedding areas R in the cavity C of the core substrate 10.

Figure 16:
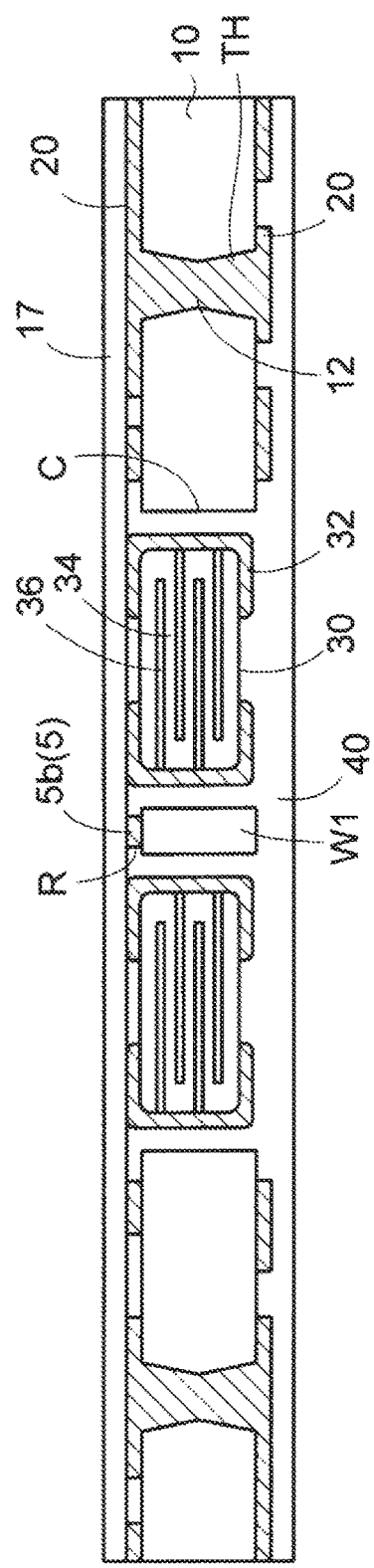
FIG. 16 is a sectional view depicting the manufacturing method of the electronic component-embedded substrate according to the exemplary embodiment (6 thereof).

Then, as shown in FIG. 16, an uncured resin film is stacked on a lower surface of the structure of FIG. 15A by hot press, and the resin film is cured by heating, so that a first insulation layer 40 is formed.

Thereby, the cavity C of the lower surface of the core substrate 10 is filled, so that the first insulation layer 40 covering the side surfaces and lower surfaces of the capacitors 30 is formed. Also, the side surfaces of the first insulation wall portions W1 and the second insulation wall portion W2 are covered by the first insulation layer 40.

Figure 17:
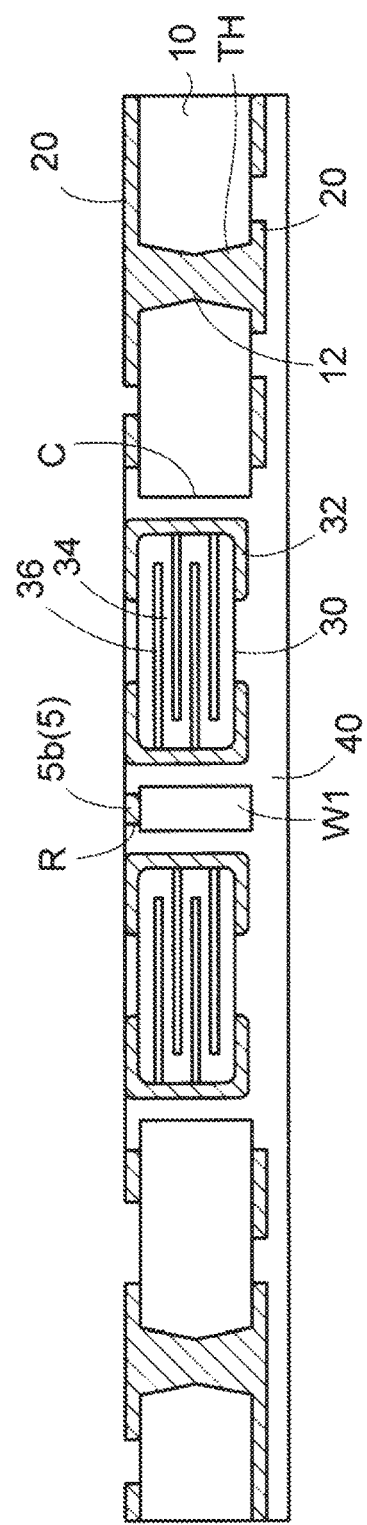
FIG. 17 is a sectional view depicting the manufacturing method of the electronic component-embedded substrate according to the exemplary embodiment (7 thereof).

Thereafter, as shown in FIG. 17, the temporary fixing tape 17 is peeled off from the core substrate 10, so that the upper surfaces of the core substrate 10 and the capacitors 30 are exposed.

Figure 18:
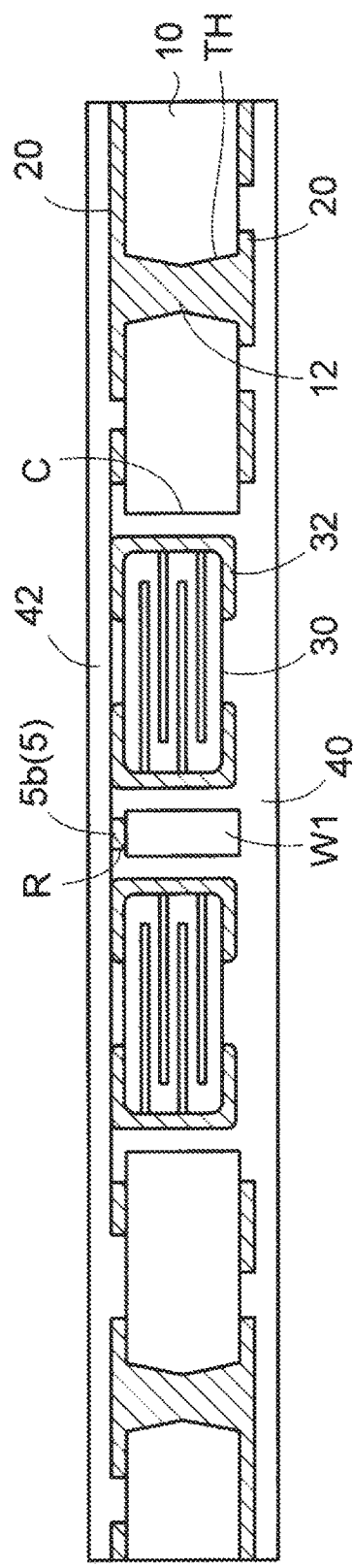
FIG. 18 is a sectional view depicting the manufacturing method of the electronic component-embedded substrate according to the exemplary embodiment (8 thereof).

Also, as shown in FIG. 18, an uncured resin film is stacked on an upper surface of the structure of FIG. 17 by hot press, and the resin film is cured by heating, so that a second insulation layer 42 is formed. Thereby, the upper surface of the core substrate 10 is formed with the second insulation layer 42 covering the upper surfaces of the capacitors 30.

As the first insulation layer 40 and the second insulation layer 42, an insulating resin such as epoxy resin, polyimide resin or the like is used. In this way, the cavity C is filled with the insulating material.

Figure 19:
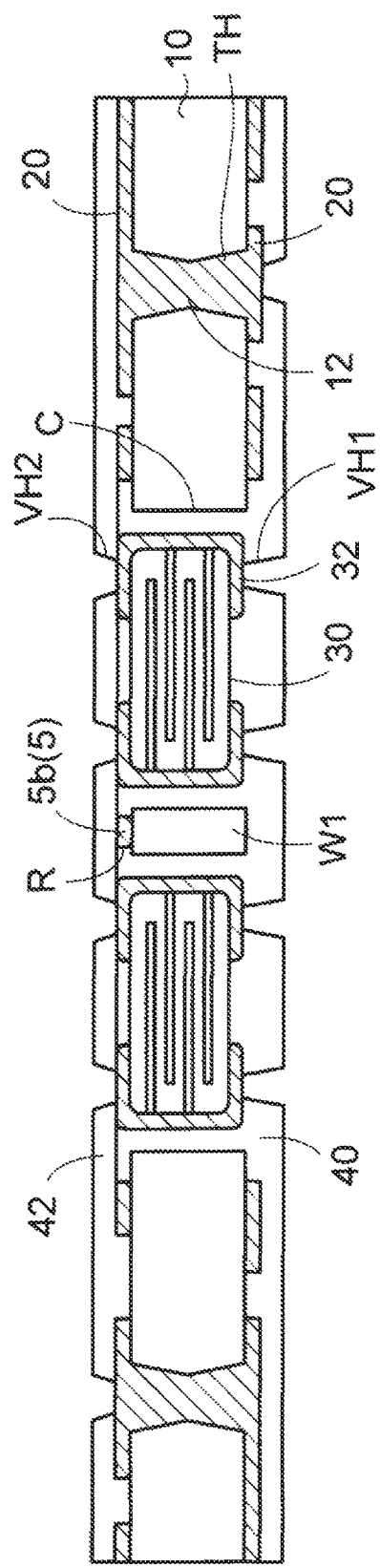
FIG. 19 is a sectional view depicting the manufacturing method of the electronic component-embedded substrate according to the exemplary embodiment (9 thereof).

Then, as shown in FIG. 19, the first insulation layer 40 formed on the lower surface of the core substrate 10 is subjected to the laser processing to form first via-holes VH1 that reach the lower surfaces of the connection terminals 32 of the capacitors 30 and the first wiring layer 20.

Also, likewise, the second insulation layer 42 formed on the upper surface of the core substrate 10 is subjected to the laser processing to form second via-holes VH2 that reach the upper surfaces of the connection terminals 32 of the capacitors 30 and the first wiring layer 20.

Figure 20:
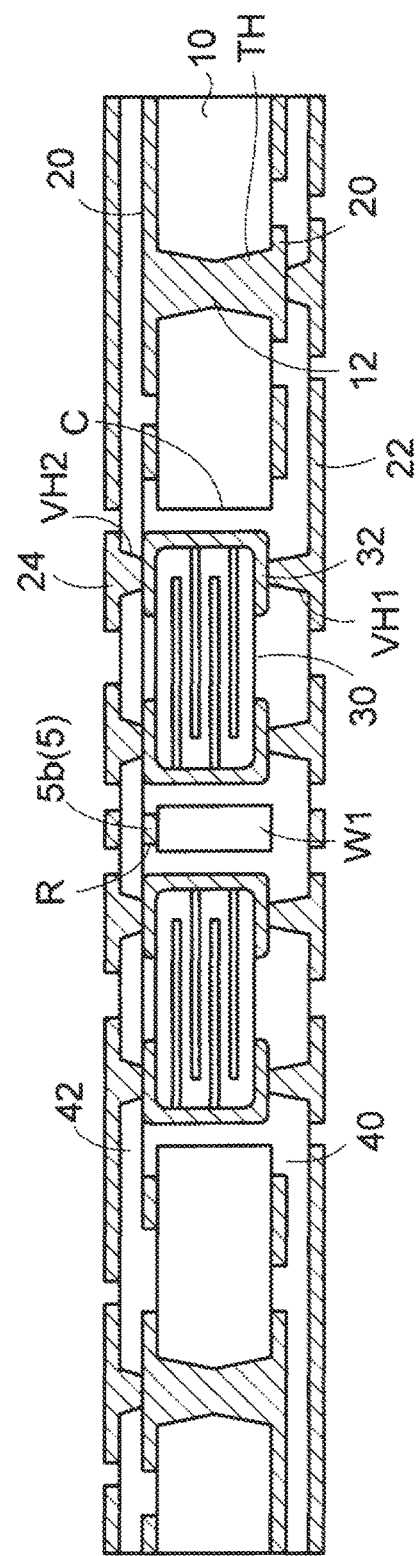
FIG. 20 is a sectional view depicting the manufacturing method of the electronic component-embedded substrate according to the exemplary embodiment (10 thereof).

Subsequently, as shown in FIG. 20, a second wiring layer 22 is formed on the first insulation layer 40 on the lower surface of the core substrate 10. The second wiring layer 22 is connected to the lower surfaces of the connection terminals 32 of the capacitors 30 and the first wiring layer 20 through the first via-holes VH1.

Also, likewise, a third wiring layer 24 is formed on the second insulation layer 42 on the upper surface of the core substrate 10. The third wiring layer 24 is connected to the upper surfaces of the connection terminals 32 of the capacitors 30 and the first wiring layer 20 through the second via-holes VH2.

The second wiring layer 22 and the third wiring layer 24 are formed by a semi-additive method. In the below, a method of forming the third wiring layer 24 is described in detail.

Figure 21A:
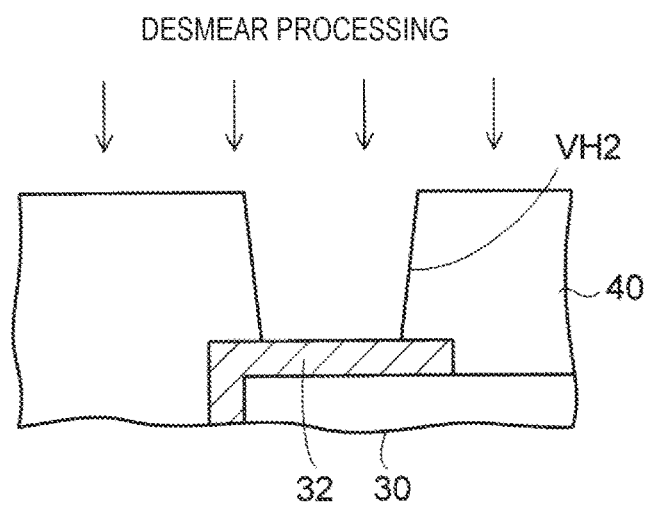
FIGS. 21A to 21C are sectional views depicting a method of forming a second wiring layer of FIG. 20 (11 thereof).

FIG. 21A is a partially enlarged view of a surrounding of the second via-hole VH2 on the left connection terminal 32 of the capacitor 30 of FIG. 19.

First, as shown in FIG. 21A, an inside of the second via-hole VH2 is subjected to desmear processing by using permanganic acid or the like, so that the resin smear in the second via-hole VH2 is removed and the second via-hold is thus cleaned.

Figure 21B:
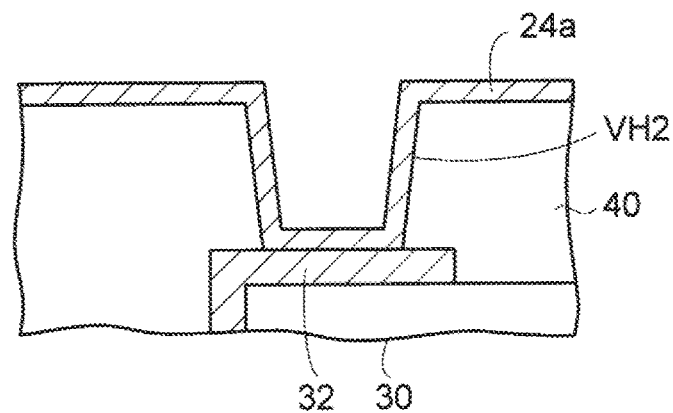

Then, as shown in FIG. 21B, an inner wall of the second via-hole VH2 and the second insulation layer 42 are formed thereon with a seed layer 24a by an electroless plating method or a sputtering method.

Figure 21C:
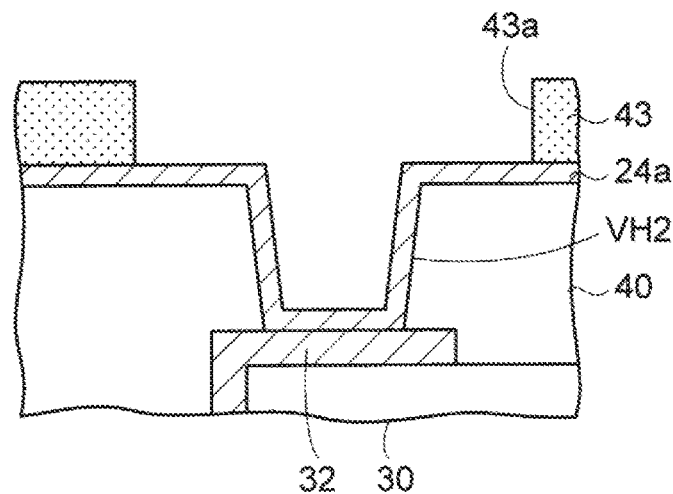

Also, as shown in FIG. 21C, a plated resist layer 43 having an opening 43a, which is formed in an area in which the third wiring layer 24 is to be arranged, is formed.

Figure 22A:
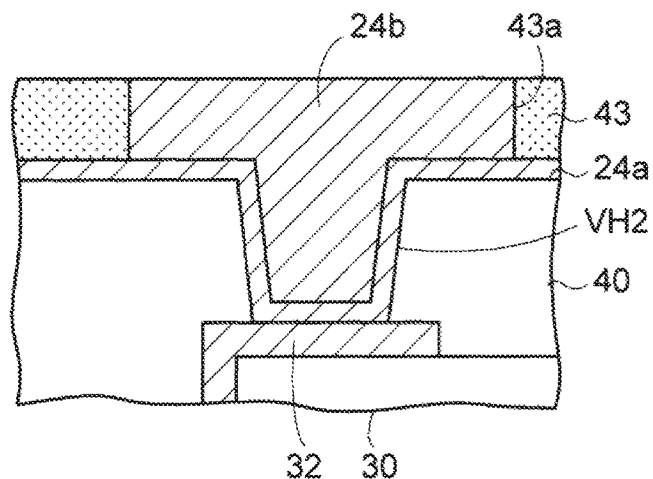
FIGS. 22A and 22B are sectional views depicting the method of forming the second wiring layer of FIG. 20 (12 thereof).

Thereafter, as shown in FIG. 22A, a metal plated layer 24b is formed to fill the second via-hole VH2 and the opening 43a of the plated resist layer 43 by an electrolytic plating method in which the seed layer 24a is used as a plating power feeding path. The seed layer 24a and the metal plated layer 24b are formed of copper or the like.

Figure 22B:
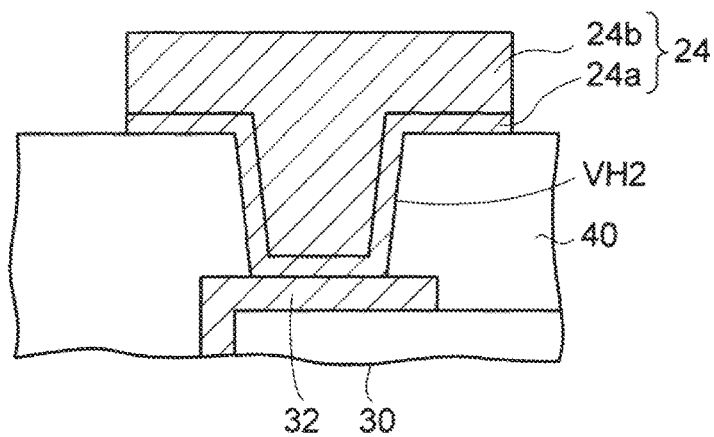

Also, as shown in FIG. 22B, after the plated resist layer 43 is removed, the seed layer 24a is etched using the metal plated layer 24b as a mask.

By the above processes, the third wiring layer 24 is formed from the seed layer 24a and the metal plated layer 24b.

Alternatively, the second wiring layer 22 and the third wiring layer 24 may be formed by a MSAP (Modified Semi Additive Process) or a subtractive method.

Figure 23:
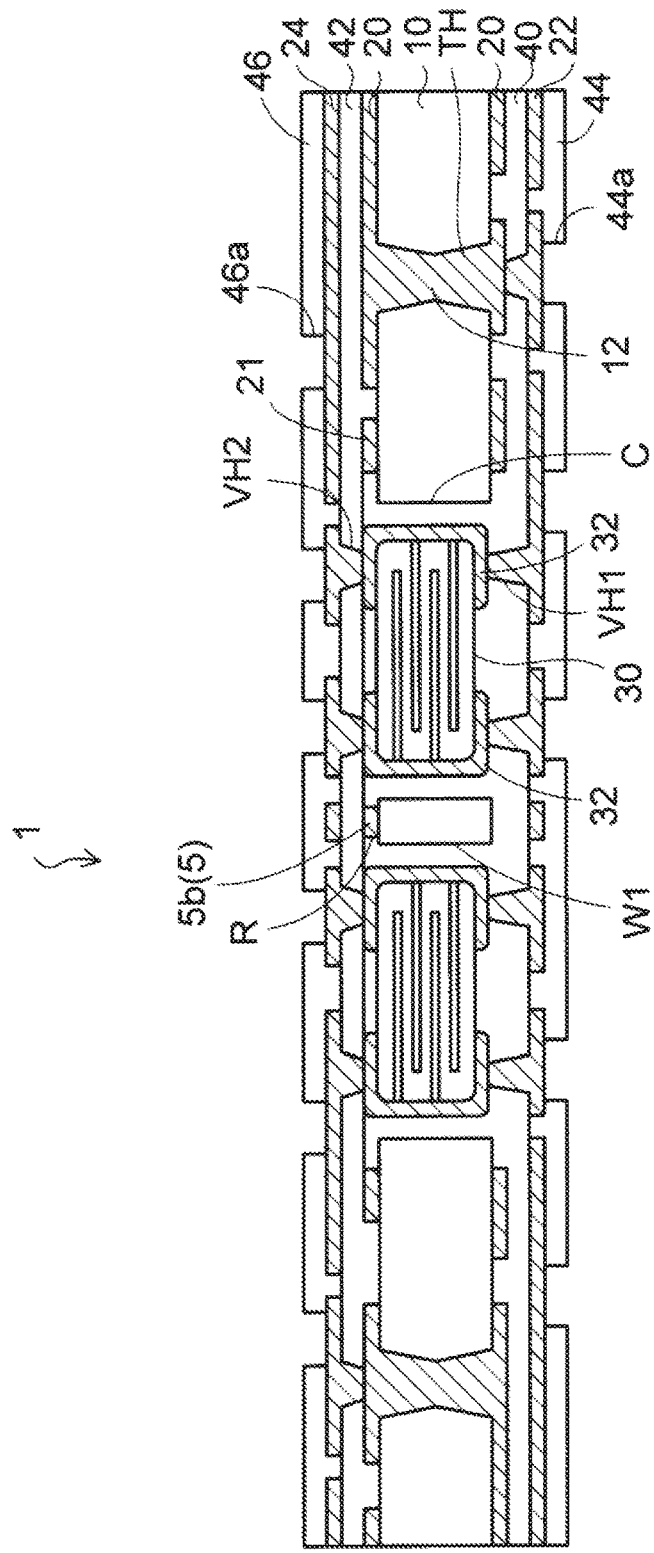
FIG. 23 is a sectional view depicting an electronic component-embedded substrate according to the exemplary embodiment.

Thereafter, as shown in FIG. 23, a solder resist layer 44 having openings 44a formed on connection portions of the second wiring layer 22 is formed on the first insulation layer 40 of FIG. 20. Also, likewise, a solder resist layer 46 having openings 46a formed on connection portions of the third wiring layer 24 is formed on the second insulation layer 42 of FIG. 20.

By the above processes, as shown in FIG. 23, an electronic component-embedded substrate 1 of the exemplary embodiment is manufactured.

As shown in FIG. 23, the electronic component-embedded substrate 1 of the exemplary embodiment has the core substrate 10 having the structure shown in FIG. 11A at a central part in a thickness direction thereof. The first wiring layers 20 are respectively formed on both surfaces of the core substrate 10. The first wiring layers 20 on both surfaces are connected to each other by means of the through-conductors 12 formed in the through-holes TH of the core substrate 10.

The core substrate 10 is formed with the cavity C penetrating the core substrate in the thickness direction. One surface of the core substrate 10 is formed with the support pattern 5 made of the same layer as the first wiring layer 20. As shown in a partial plan view of FIG. 15B, the cavity C is divided into the four component embedding areas R by the support pattern 5, as seen from a plan view. The capacitors 30 are respectively mounted in the four component embedding areas R of the cavity C.

The structure around the cavity C and the arrangement of the capacitors 30 will be described later in detail with reference to a partial plan view of FIG. 24A to 24C.

Also, the lower surface of the core substrate 10 is formed with the first insulation layer 40, and the side surfaces and lower surfaces of the capacitors 30 and the first wiring layer 20 are covered with the first insulation layer 40.

The first insulation layer 40 is filled between the inner wall of the cavity C of the core substrate 10 and the side surface of each capacitor 30. Also, the first insulation layer 40 is filled between the four capacitors 30. In this way, the first insulation layer 40 (insulating material) fills the inside of the cavity C.

Also, the upper surface of the core substrate 10 is formed thereon with the second insulation layer 42. The upper surfaces of the capacitors 30 and the first wiring layer 20 are covered with the second insulation layer 42.

The first insulation layer 40 is formed with the first via-holes VH1 that reach the lower surfaces of the connection electrodes 32 of the capacitors 30 and the first wiring layer 20 provided at the lower side of the core substrate 10. The first insulation layer 40 is formed thereon with the second wiring layer 22. The second wiring layer 22 is connected to the lower surfaces of the connection electrodes 32 of the capacitors 30 and the first wiring layer 20 through the via conductors in the first via-holes VH1.

Also, the second insulation layer 42 is formed with the second via-holes VH2 that reach the upper surfaces of the connection electrodes 32 of the capacitors 30 and the first wiring layer 20 provided at the upper side of the core substrate 10. The second insulation layer 42 is formed thereon with the third wiring layer 24. The third wiring layer 24 is connected to the upper surfaces of the connection electrodes 32 of the capacitors 30 and the first wiring layer 20 through the via conductors in the second via-holes VH2.

Also, the solder resist layer 44 having the openings 44a formed on the connection portions of the second wiring layer 22 is formed on the first insulation layer 40. Also, likewise, the solder resist layer 46 having the openings 46a formed on the connection portions of the third wiring layer 24 is formed on the second insulation layer 42.

In the example of FIG. 23, the two wiring layers are respectively stacked on both the surfaces of the core substrate 10. However, the number of the wiring layers to be stacked on both the surfaces of the core substrate 10 may be arbitrarily set.

Subsequently, the structure around the cavity C and the arrangement of the capacitors 30 are described with reference to FIGS. 24A to 24C.

Figure 24A:
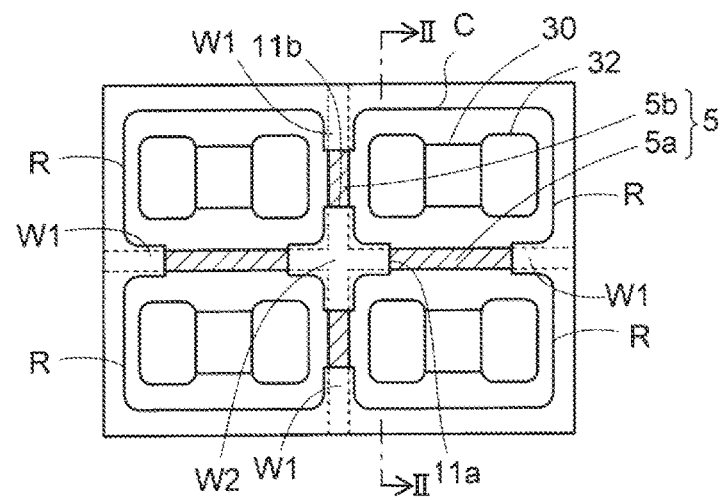
FIGS. 24A to 24C are a plan view and a sectional view depicting a structure around a cavity of the electronic component-embedded substrate shown in FIG. 23 and an aspect of capacitors arranged in the cavity.

FIG. 24A is a partial plan view depicting an aspect of the four capacitors arranged in the cavity C of FIG. 23, as seen from below. FIG. 24B is a plan view depicting only the support pattern 5 of FIG. 24A, as seen from back. FIG. 24C is a sectional view taken along a line II-II of FIG. 24A.

As shown in FIG. 24A, the cross-shaped support pattern 5 is arranged in the cavity C of the core substrate 10, as seen from a plan view. The cross-shaped support pattern 5 is arranged to extend over the cavity C in the lateral and longitudinal directions.

Figure 24B:
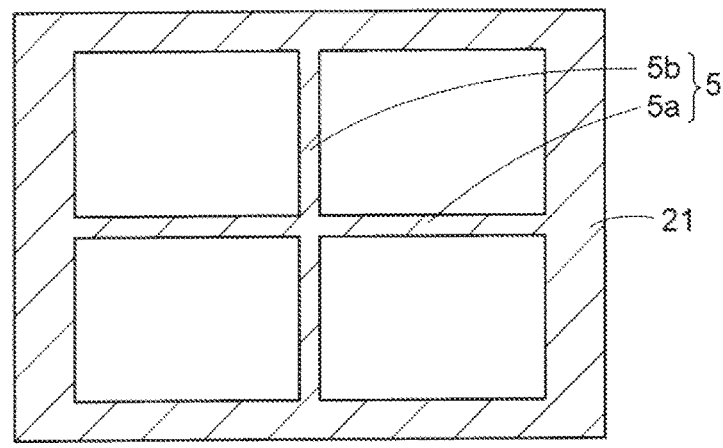

As shown in FIG. 24B, the cross-shaped support pattern 5 is configured by the lateral pattern 5a and the longitudinal pattern 5b intersecting with each other. Both ends of each of the lateral pattern 5a and the longitudinal pattern 5b of the support pattern 5 are coupled and supported to the ring-shaped conductor layer 21 formed on the upper surface of the core substrate 10.

Also, as shown in FIG. 24A, the first insulation wall portions W1 having a projection shape protruding inward from the sidewalls of the cavity C are formed on both end portions of the lateral pattern 5a and the longitudinal pattern 5b of the cross-shaped support pattern 5. The first insulation wall portions W1 are formed with being coupled to the core substrate 10. The first insulation wall portions W1 are arranged as protruding wall portions protruding from the core substrate 10 towards the inside of the cavity C.

Also, the support pattern 5 has an intersection part at which the band-shaped lateral pattern 5a and the band-shaped longitudinal pattern 5b intersect with each other. The second insulation wall portion W2 is arranged as a cross-shaped wall portion on the intersection part of the lateral pattern 5a and the longitudinal pattern 5b. The second insulation wall portion W2 is arranged with being separated from the core substrate 10. The first insulation wall portions W1 and the second insulation wall portion W2 are arranged on the inner surface of the support pattern 5 facing towards the cavity C.

The first openings 11a are formed between the two first insulation wall portions W1 facing each other in the lateral direction and the lateral pattern of the cross-shaped second insulation wall portion W2. Also, the second openings 11b are formed between the two first insulation wall portions W1 facing each other in the longitudinal direction and the longitudinal pattern of the cross-shaped second insulation wall portion W2.

In this way, the first insulation wall portions W1 and the second insulation wall portion W2 are arranged with being separated from each other.

Although the favorable arrangement of the insulation wall portions has been exemplified, the insulation wall portions may be arranged at portions on the support pattern in the cavity.

As shown in FIG. 24A, the four component embedding areas R are defined in the cavity C by the cross-shaped support pattern 5, as seen from a plan view. The four component embedding areas R are coupled by the first openings 11a and the second openings 11b, so that one collective cavity C is established.

As described above, the first insulation wall portions W1 and the second insulation wall portion W2 are arranged as portions of the core substrate 10 are left on the inner surface of the support pattern 5 when forming the cavity C by laser processing the core substrate 10. Therefore, the first insulation wall portions W1 and the second insulation wall portion W2 are made of the same material as the core substrate 10.

The capacitors 30 are respectively arranged in the four component embedding areas R in the cavity C. In this way, the four capacitors 30 are arranged in the cavity C.

The first insulation wall portions W1 and the second insulation wall portion W2 are arranged on the inner surface of the support pattern 5 between the plurality of capacitors 30.

In this way, in the exemplary embodiment, the cross-shaped support pattern 5 is arranged to extend over the cavity C on one surface of the core substrate 10, and the first insulation wall portions W1 and the second insulation wall portion W2 are arranged on the inner surface of the support pattern 5. The support pattern 5 functions as a support body for supporting the first insulation wall portions W1 and the second insulation wall portion W2.

The first insulation wall portions W1 are arranged as a projection shape on both end portions of the lateral pattern 5a and the longitudinal pattern 5b of the cross-shaped support pattern 5 with being coupled to the core substrate 10.

In addition, the support pattern 5 is used as the support body, so that the cross-shaped second insulation wall portion W2 can be arranged in an area, to which the connection terminals 32 of the four capacitors 30 are adjacent, with being separated from the core substrate 10.

Thereby, the first insulation wall portion W1 and the second insulation wall portion W2 are arranged between the connection electrodes 32 of the two capacitors 30 adjacent to each other in the lateral direction. Also, the first insulation wall portion W1 and the second insulation wall portion W2 are arranged between the connection electrodes 32 of the two capacitors 30 adjacent to each other in the longitudinal direction.

Figure 25:
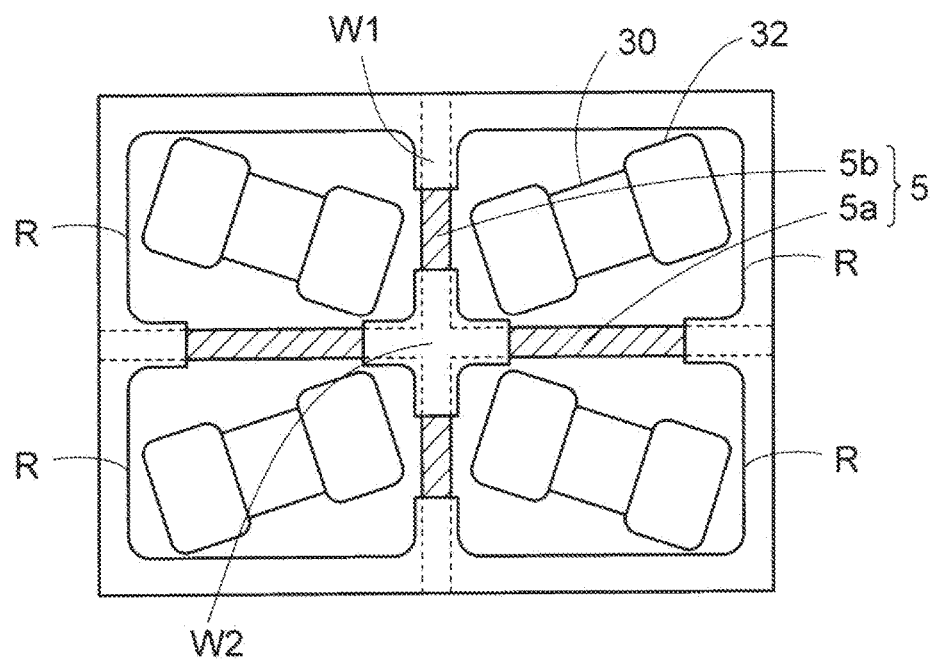
FIG. 25 is a plan view depicting an aspect where four electronic components of the electronic component-embedded substrate shown in FIG. 23 are arranged with being out of alignment.

For this reason, even though the capacitors are inclined or positionally deviated in the lateral and longitudinal directions when mounting the four capacitors 30 in a two-row and two-column form in the lateral and longitudinal directions, as shown in FIG. 25, the connection electrodes 32 of the capacitors 30 are prevented from contacting each other.

Even when the capacitors are inclined or positionally deviated, the connection electrodes 32 of the capacitors 30 adjacent to each other are contacted to the first insulation wall portions W1 and the second insulation wall portion W2, so that the electric short between the capacitors 30 is prevented.

In the exemplary embodiment, the insulation wall portion is formed on the support pattern 5 functioning as a support body. Therefore, the insulation wall portion can be arranged at any position on the support pattern 5 with being separated from the core substrate 10.

Also, when narrowing an arrangement pitch of the capacitors 300 to improve a mounting density, even though the wall thickness of the insulation wall portion is greatly reduced, the insulation wall portion is reinforced by the support pattern 5, so that the sufficient strength is secured.

For this reason, even though the wall thickness of the insulation wall portion is set to be small, when mounting the capacitors or when sealing the capacitors with the resin, the insulation wall portion is prevented from being damaged, so that the insulation wall portion can be reliably arranged.

Figure 24C:
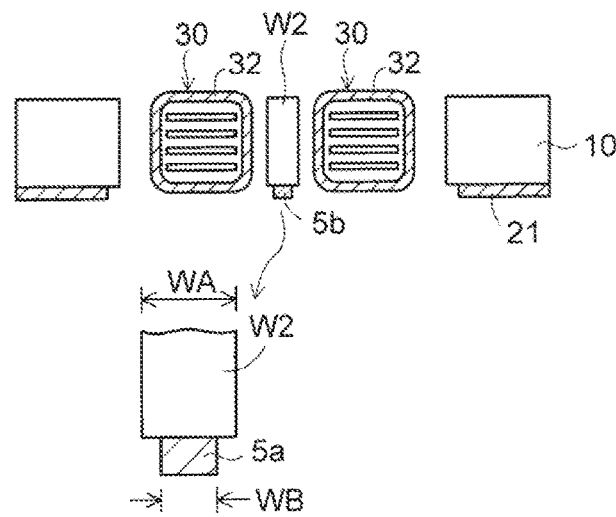

Also, as shown in FIG. 24C, a width WA of the second insulation wall portion W2 is set greater than a width WB of the support pattern 5. Also, likewise, a width of the first insulation wall portion W1 is set greater than the width of the support pattern 5.

Thereby, even when the connection electrode 32 of the capacitor 30 is contacted to the first insulation wall portion W1 and the second insulation wall portion W2, it is not contacted to the support pattern 5. Therefore, since it is possible to prevent the electric short between the capacitors 30, it is possible to improve the mounting density by narrowing the arrangement pitch of the plurality of capacitors 30.

In FIG. 24C, a height of the second insulation wall portion W2 is set to be the same as the thickness of the core substrate 10. However, the height of the second insulation wall portion W2 may be set lower than the thickness of the core substrate 10. A height of the first insulation wall portion W1 is also the same.

Also, as shown in FIG. 24A, if the second insulation wall portion W2 is not provided in the area (the central portion of the cavity C1 to which the four capacitors 30 are adjacent, it is difficult to fill the resin in the corresponding area, so that the first insulation layer 40 may be formed into a concave shape.

In FIG. 24A, since the second insulation wall portion W2 is arranged in advance in the area to which the four capacitors 30 are adjacent, it is not necessary to fill the resin in the corresponding area. For this reason, when sealing the four capacitors 30 with the resin, it is possible to reliably fill the resin.

In addition, it is possible to arrange the insulation wall portion in any area, in which it is difficult to fill the resin, of the areas between the plurality of capacitors 30.

Like this, the insulation wall portion is arranged on the support pattern 5, so that it is possible to prevent the electric short between the plurality of capacitors 30 and to arrange the insulation wall portion at the optimal position at which the resin is favorably filled.

Thereby, it is possible to establish the highly reliable electronic component-embedded substrate.

Figure 26:
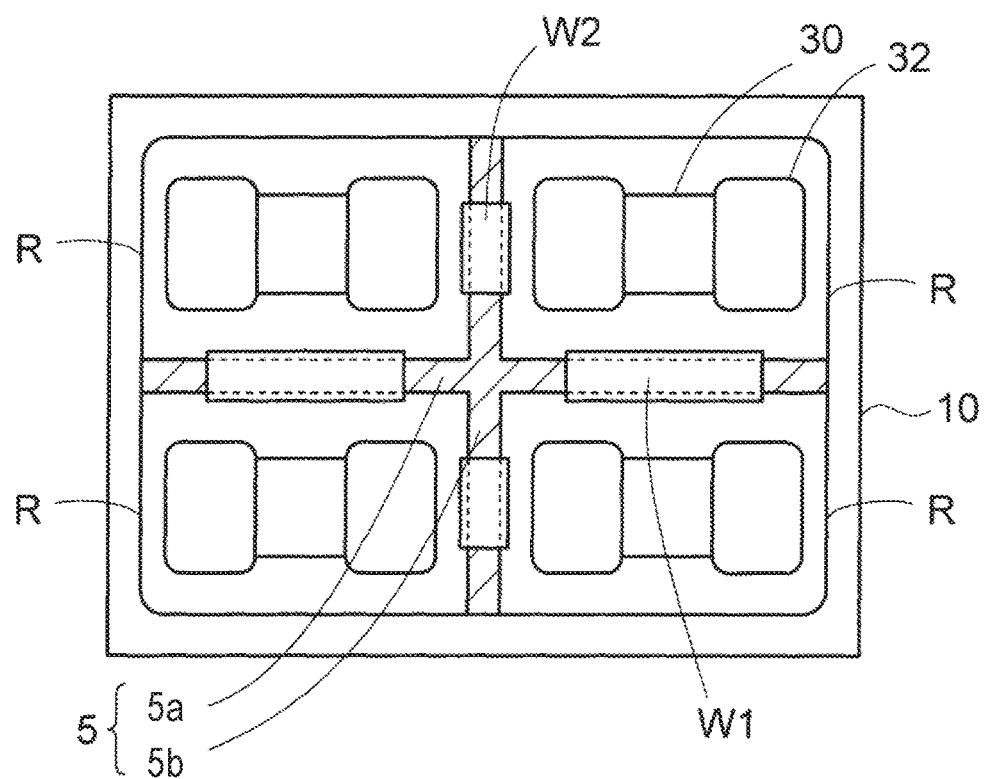
FIG. 26 is a plan view depicting an electronic component-embedded substrate according to a first modified embodiment of the exemplary embodiment.

FIG. 26 depicts a first modified embodiment of the exemplary embodiment. As shown in FIG. 26, in the first modified embodiment, like FIG. 24A, the cavity C is divided into the four component embedding areas R by the cross-shaped support pattern 5. The capacitors 30 are respectively arranged in the four component embedding areas R in the cavity C.

The first insulation wall portions W1 are respectively arranged at the central portions of the lateral pattern 5a at both sides of the longitudinal pattern 5b of the support pattern 5. The first insulation wall portions W1 are arranged with being separated from the core substrate 10. Also, the first insulation wall portion W1 is arranged to extend in the lengthwise direction so that both end portions thereof are arranged between both the connection electrodes 32 of the capacitors 30 adjacent to each other in the longitudinal direction.

Also, the second insulation wall portions W2 are respectively arranged at the central portions of the longitudinal pattern 5b at both sides of the lateral pattern 5a of the support pattern 5. The second insulation wall portions W2 are arranged with being separated from the core substrate 10. Also, the second insulation wall portion W2 is arranged between the connection electrodes 32 of the capacitors 30 adjacent to each other in the lateral direction.

Also in the first modified embodiment of FIG. 26, like FIG. 25, even when the capacitors 30 are inclined or positionally deviated, the connection electrodes 32 of the capacitors 30 are prevented from contacting each other.

FIG. 27 depicts a second modified embodiment of the exemplary embodiment. As shown in FIG. 27, in the second modified embodiment, the two first insulation wall portions W1 are arranged with being separated on the lateral pattern 5a of each of both sides of the longitudinal pattern 5b of the support pattern 5. The first insulation wall portion W1 is arranged with being separated from the core substrate 10.

The first insulation wall portions W1 are arranged with being separated between both the connection electrodes 32 of the capacitors 30 adjacent to each other in the longitudinal direction.

Also, like FIG. 26, the second insulation wall portions W2 are respectively arranged at the central portions of the longitudinal pattern 5b at both sides of the lateral pattern 5a of the support pattern 5.

Also in the second modified embodiment of FIG. 27, like FIG. 25, even when the capacitors 30 are inclined or positionally deviated, the connection electrodes 32 of the capacitors 30 are prevented from contacting each other.

Subsequently, a case of mounting the two capacitors is described. FIG. 28A is a partial plan view depicting a structure around the cavity of the electronic component-embedded substrate when mounting the two capacitors. FIG. 28B is a partial plan view depicting the support pattern when mounting the two capacitors.

In the example of FIG. 28A, the two capacitors are arranged side by side in the lateral direction. Referring to FIG. 28B, the support pattern 5 is arranged to extend over the cavity C in the longitudinal direction, and is coupled and supported to the ring-shaped conductor layer 21 arranged on the core substrate 10. The support pattern 5 has a band shape narrower than an opening width of the cavity C.

As shown in FIG. 28A, the insulation wall portions W having a projection shape protruding inward from the sidewalls of the cavity C are arranged on the inner surfaces of both end portions of the support pattern 5.

When mounting the two capacitors 30, the insulation wall portions W are arranged on the support pattern 5, so that the sufficient strength can be secured even though the wall thickness of the insulation wall portion W is thinned to extend the protruding length thereof. Also, the insulation wall portion W can be arranged at any position with being separated from the core substrate 10.

Also, the two capacitors may be arranged side by side in the longitudinal direction. Also in this case, the band-shaped support pattern is arranged between the two capacitors, and the insulation wall portion is arranged at any position of the inner surface of the support pattern.

In addition, the support pattern 5 having a lattice shape may be arranged in the cavity C of the core substrate 10 to divide the inside of the cavity C into the arbitrary number of the component embedding areas R, and the arbitrary number of the capacitors 30 may be mounted therein. Also in this case, the insulation wall portion is arranged at a position between the capacitors 30 so that the electric short is not to occur between the capacitors 30.

Also, the band-shaped the support pattern 5 may be simultaneously formed and used as the component mounting pattern in the respective component embedding areas R of the cavity C, to which the capacitors 30 are to be arranged. In this case, in the process of FIGS. 15A and 15B, the temporary fixing tape 17 is not used and the capacitors 30 are fixed to the inner surface of the component mounting pattern by an adhesive.

FIG. 29 depicts an electronic component device 2 for which the electronic component-embedded substrate 1 of FIG. 23 is used. As shown in FIG. 29, in the electronic component device 2 of the exemplary embodiment, pads of a semiconductor chip 50 are flip-chip connected to the connection portions of the third wiring layer 24 provided on the upper surface-side of the electronic component-embedded substrate 1 of FIG. 23 by bump electrodes 52 such as solders.

The semiconductor chip 50 is electrically connected to the capacitors 30 via the third wiring layer 24 and the first wiring layer 20.

Also, an underfill resin 54 is filled between the electronic component-embedded substrate 1 and the semiconductor chip 50. The semiconductor chip 50 is an LSI chip such as a CPU, for example. The capacitor 30 of the electronic component-embedded substrate 1 is an example of the first electronic component, and the semiconductor chip 50 is an example of the second electronic component.

Also, the connection portions of the second wiring layer 22 provided on the lower surface-side of the electronic component-embedded substrate 1 are provided with external connection terminals T such as solder balls.

In the electronic component device 2 of the exemplary embodiment, the capacitors 30 embedded in the electronic component-embedded substrate 1 function as decoupling capacitors arranged between a power supply line and a ground line of the semiconductor chip 50. The decoupling capacitor is used so as to stabilize a power supply voltage and to reduce a high-frequency noise.

As described above, in the electronic component-embedded substrate 1, even when the support pattern 5 and the first and second insulation wall portions W1, W2 are arranged in the cavity C, the plurality of component embedding areas R is defined in the cavity C. The capacitors 30 are respectively arranged in the plurality of component embedding areas R in the cavity C.

For this reason, since it is possible to connect a wiring line to the upper surface and the lower surfaces of the connection terminals 32 of the capacitors 30, it is possible to improve the degree of design freedom of the decoupling capacitors.

This disclosure further encompasses various exemplary embodiments, for example, described below.

1. A manufacturing method of an electronic component-embedded substrate, the method comprising:
   preparing a core substrate;
   forming a wiring layer and a support pattern formed of the same layer as the wiring layer on one surface of the core substrate;
   forming a plurality of component embedding areas penetrating the core substrate at positions at which the component embedding areas face each other with the support pattern being interposed therebetween;
   forming one cavity, in which the plurality of component embedding areas is coupled, and forming an insulation wall portion formed of the same material as the core substrate on the support pattern by removing a portion of the core substrate positioned on the support pattern between the plurality of component embedding areas;
   mounting each of electronic components in each of the plurality of component embedding areas; and
   filling an inside of the cavity with an insulating material.

2. The manufacturing method according to claim 1, wherein in the forming the insulation wall portion, the portion of core substrate on the support pattern is removed by laser processing.

What is claimed is:

1. An electronic component-embedded substrate comprising:
   a core substrate;
   a cavity penetrating the core substrate;
   a wiring layer formed on one surface of the core substrate;
   a support pattern bridging over the cavity and directly contacting opposed edges of the core substrate defining the cavity, the support pattern configured to divide the cavity into a plurality of component embedding areas;
   an insulation wall portion arranged on only part of the support pattern in the cavity, with another part of the support pattern in the cavity being exposed from the insulation wall portion, the insulation wall portion being disposed in the cavity, the insulation wall portion being formed of a same material as the core substrate;
   a plurality of electronic components each of which is mounted in each of the plurality of component embedding areas; and
   an insulating material filling an inside of the cavity.

2. The electronic component-embedded substrate according to claim 1, wherein the support pattern is formed of a same layer as the wiring layer.

3. The electronic component-embedded substrate according to claim 1, wherein the insulation wall portion comprises an island-shaped wall portion separated from the core substrate.

4. The electronic component-embedded substrate according to claim 3, wherein the support pattern has an intersection part at which a plurality of band-shaped patterns intersects, and
wherein the island-shaped wall portion is a cross-shaped wall portion arranged on the intersection part.

5. The electronic component-embedded substrate according to claim 1, wherein the insulation wall portion comprises a protrusion wall portion protruding inward from the core substrate towards the cavity.

6. The electronic component-embedded substrate according to claim 1, wherein a width of the insulation wall portion is greater than a width of the support pattern.

7. The electronic component-embedded substrate according to claim 1, further comprising:
via-holes formed in the insulating material and reaching one surfaces of connection terminals of the electronic components; and
a wiring layer formed on one surface of the insulating material and connected to one surfaces of the connection terminals of the electronic components through the via-holes.

8. The electronic component-embedded substrate according to claim 1, wherein the support pattern and the wiring layer are made of a same material.

9. An electronic component device comprising:
an electronic component-embedded substrate including
a core substrate,
a cavity penetrating the core substrate,
a wiring layer formed on one surface of the core substrate,
a support pattern bridging over the cavity and directly contacting opposed edges of the core substrate defining the cavity, the support pattern configured to divide the cavity into a plurality of component embedding areas,
an insulation wall portion arranged on only part of the support pattern in the cavity, with another part of the support pattern in the cavity being exposed from the insulation wall portion, the insulation wall portion being disposed in the cavity, and the insulation wall portion being formed of a same material as the core substrate,
a plurality of first electronic components each of which is mounted in each of the plurality of component embedding areas, and
an insulating material filling an inside of the cavity; and
a second electronic component mounted on the electronic component-embedded substrate and electrically connected to at least one of the first electronic components.

10. The electronic component device according to claim 9, wherein the support pattern is formed of a same layer as the wiring layer.

11. The electronic component device according to claim 9, wherein the support pattern and the wiring layer are made of a same material.

* * * * *